(12) United States Patent
Park

(10) Patent No.: US 11,804,535 B2
(45) Date of Patent: Oct. 31, 2023

(54) SEMICONDUCTOR DEVICE AND METHOD FOR FABRICATING THE SAME

(71) Applicant: Samsung Electronics Co., Ltd., Suwon-si (KR)

(72) Inventor: Jong Chul Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 541 days.

(21) Appl. No.: 15/990,949

(22) Filed: May 29, 2018

(65) Prior Publication Data
US 2019/0165121 A1 May 30, 2019

(30) Foreign Application Priority Data

Nov. 28, 2017 (KR) .......................... 10-2017-0159980

(51) Int. Cl.
| | |
|---|---|
| *H01L 29/66* | (2006.01) |
| *H01L 29/49* | (2006.01) |
| *H01L 29/78* | (2006.01) |
| *H01L 21/28* | (2006.01) |
| *H01L 29/775* | (2006.01) |
| *H01L 29/417* | (2006.01) |
| *H01L 29/423* | (2006.01) |

(52) U.S. Cl.
CPC .... *H01L 29/4983* (2013.01); *H01L 21/28114* (2013.01); *H01L 21/28132* (2013.01); *H01L 29/41775* (2013.01); *H01L 29/42376* (2013.01); *H01L 29/6653* (2013.01); *H01L 29/6656* (2013.01); *H01L 29/66545* (2013.01); *H01L 29/66795* (2013.01); *H01L 29/775* (2013.01); *H01L 29/785* (2013.01); *H01L 29/7851* (2013.01)

(58) Field of Classification Search
CPC ....... H01L 21/28132; H01L 21/823468; H01L 21/823864; H01L 29/66545; H01L 29/6656; H01L 29/66795; H01L 29/7851; H01L 29/4983
See application file for complete search history.

(56) References Cited

U.S. PATENT DOCUMENTS

| | | | |
|---|---|---|---|
| 6,468,915 B1 * | 10/2002 | Liu | .................. H01L 21/02164 |
| | | | 257/E21.029 |
| 7,183,610 B2 | 2/2007 | Pattanayak et al. | |
| 8,193,641 B2 | 6/2012 | Rachmady et al. | |
| 8,338,892 B2 | 12/2012 | Kronholz et al. | |
| 8,735,270 B2 | 5/2014 | Hempel et al. | |
| 8,928,048 B2 | 1/2015 | Xie et al. | |
| 9,064,801 B1 | 6/2015 | Horak et al. | |
| 9,257,348 B2 | 2/2016 | Xie et al. | |
| 9,484,346 B2 | 11/2016 | Chen | |
| 9,548,366 B1 * | 1/2017 | Ho | ..................... H01L 29/6656 |
| 9,627,514 B1 | 4/2017 | Kim et al. | |
| 9,627,537 B1 | 4/2017 | Chang | |
| 2007/0241411 A1 | 10/2007 | Yang et al. | |

(Continued)

*Primary Examiner* — Eric K Ashbahian
(74) *Attorney, Agent, or Firm* — Muir Patent Law, PLLC

(57) ABSTRACT

A semiconductor device with improved reliability and a method for fabricating the same are provided. The semiconductor device includes a substrate, a first spacer defining a gate trench on the substrate, and a gate electrode in the gate trench, wherein a height of an upper surface of the gate electrode adjacent to the first spacer increases in a direction away from the first spacer.

18 Claims, 33 Drawing Sheets

(56) References Cited

U.S. PATENT DOCUMENTS

| | | | |
|---|---|---|---|
| 2011/0101470 A1 | 5/2011 | Hempel et al. | |
| 2011/0298017 A1* | 12/2011 | Jain | H01L 21/76897 257/288 |
| 2015/0162201 A1* | 6/2015 | Lee | H01L 21/28247 257/410 |
| 2016/0104704 A1* | 4/2016 | Fang | H01L 29/4966 257/392 |
| 2016/0365426 A1* | 12/2016 | Ching | H01L 29/66795 |
| 2017/0117380 A1* | 4/2017 | Lu | H01L 29/6656 |
| 2018/0151678 A1* | 5/2018 | Li | H01L 29/785 |
| 2018/0151716 A1* | 5/2018 | Fung | H01L 29/785 |

* cited by examiner

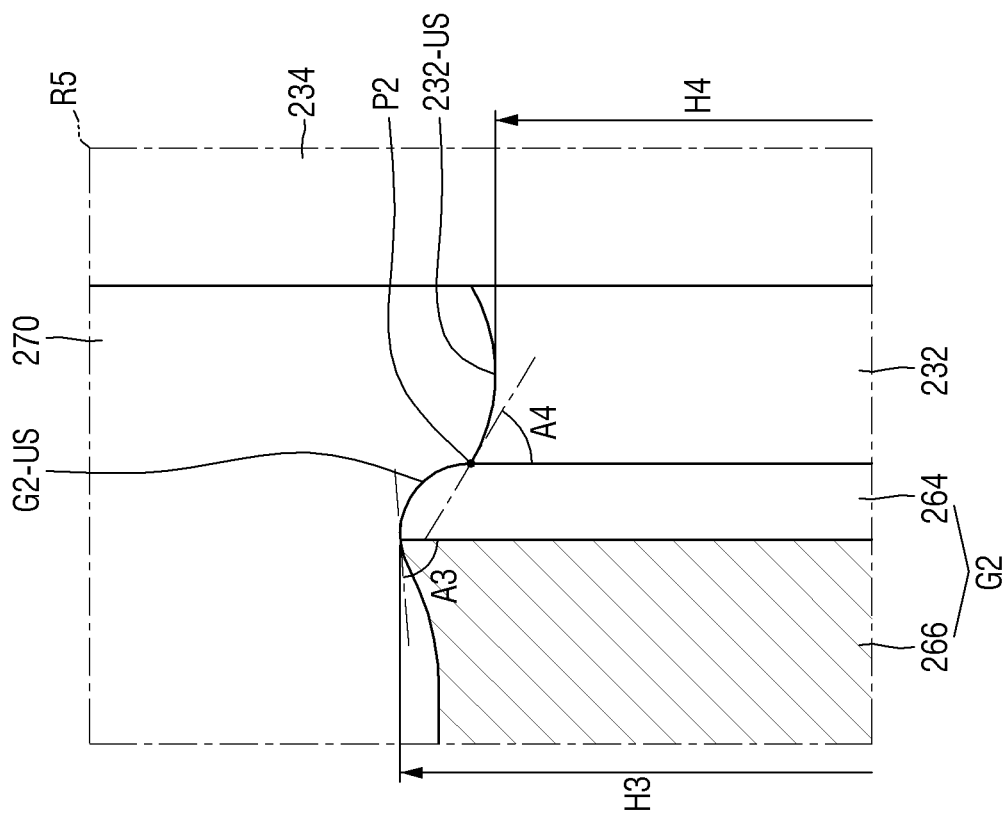

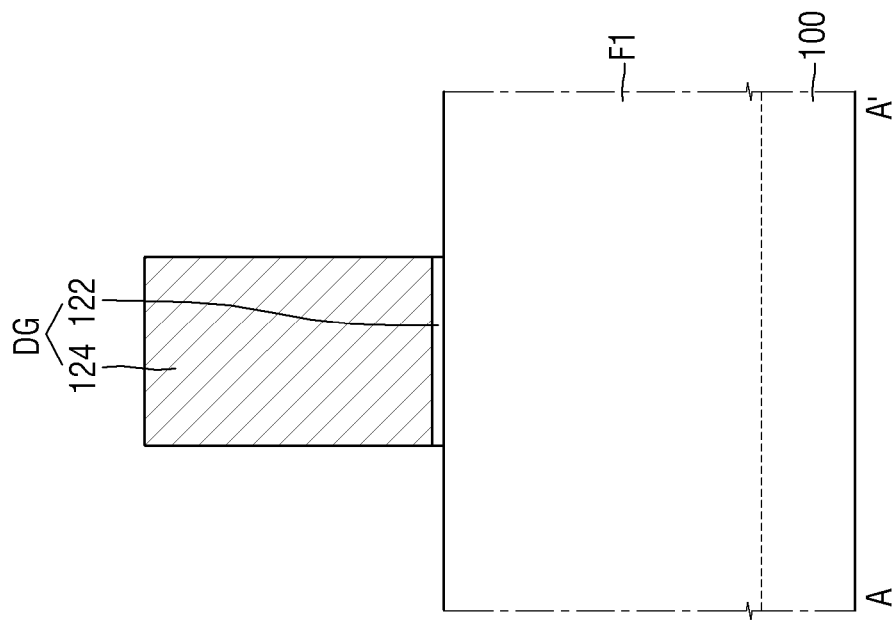

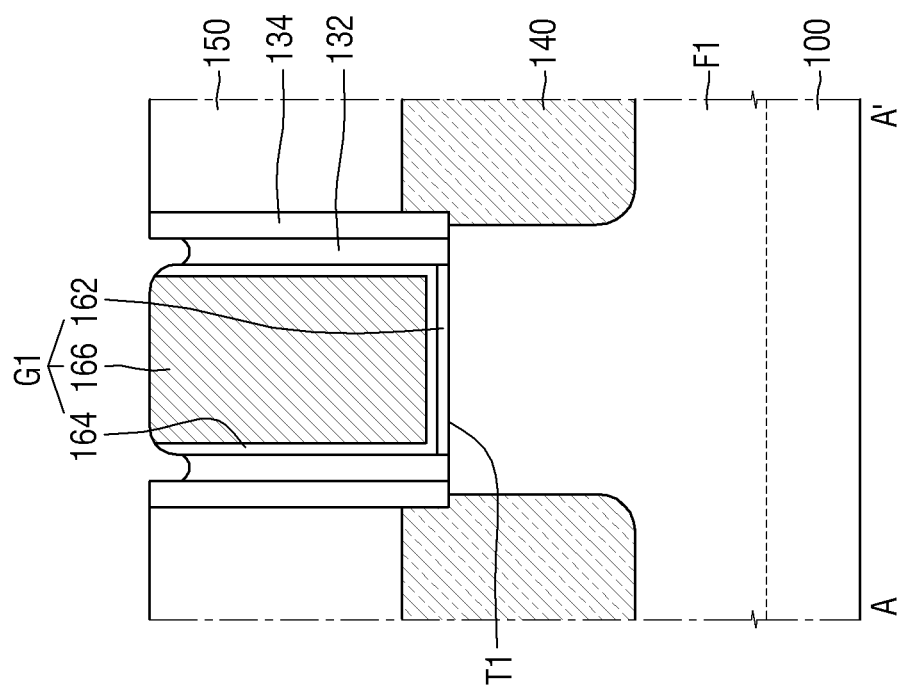

SEMICONDUCTOR DEVICE AND METHOD FOR FABRICATING THE SAME

CROSS-REFERENCE TO RELATED APPLICATION

This application claims priority from Korean Patent Application No. 10-2017-0159980 filed on Nov. 28, 2017 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device and a method for fabricating the same.

2. Description of the Related Art

As one of scaling techniques for increasing the density of a semiconductor device, there has been proposed a multi-gate transistor obtained by forming a fin-shaped silicon body on a substrate and forming gates on the surface of the silicon body.

Since the multi-gate transistor uses a three-dimensional channel, scaling may be easy. Further, the current control capability may be improved without increasing the gate length of the multi-gate transistor. In addition, a short channel effect (SCE) in which the potential of a channel region is affected by a drain voltage may be effectively suppressed.

Meanwhile, as the semiconductor device is highly integrated, an influence of a leakage current generated in the semiconductor device increases gradually. This leakage current causes a reduction in reliability of the semiconductor device.

SUMMARY

Aspects of the present inventive concept, according to exemplary embodiments, provide a semiconductor device with improved reliability.

Aspects of the present inventive concept, according to exemplary embodiments, also provide a method for fabricating a semiconductor device with improved reliability.

However, aspects of the present inventive concept are not restricted to those set forth herein. The above and other aspects of the present inventive concept will become more apparent to one of ordinary skill in the art to which the present inventive concept pertains by referencing the detailed description of the present inventive concept given below.

According to aspects of the present inventive concept, there is provided a semiconductor device comprising a substrate, a first spacer defining a gate trench on the substrate, and a gate electrode in the gate trench, wherein a height of an upper surface of the gate electrode adjacent to the first spacer increases in a direction away from the first spacer.

According to aspects of the present inventive concept, there is provided a semiconductor device comprising a substrate, a gate structure on the substrate, and a spacer on a sidewall of the gate structure, wherein the gate structure includes a convex upper surface with respect to an upper surface of the substrate, and the spacer includes a concave upper surface with respect to the upper surface of the substrate.

According to aspects of the present inventive concept, there is provided a semiconductor device comprising a substrate, a gate structure on the substrate, and a spacer on a sidewall of the gate structure, wherein an upper surface of the spacer is in contact with a sidewall of the gate structure at a first point, and wherein a height of a lowermost portion of the upper surface of the spacer in a direction perpendicular to an upper surface of the substrate is lower than a height of the first point in the direction perpendicular to the upper surface of the substrate.

According to aspects of the present inventive concept, there is provided a semiconductor device comprising a substrate including a first region and a second region, a first gate structure on the first region of the substrate, a first spacer on a sidewall of the first gate structure, a second gate structure on the second region of the substrate, and a second spacer on a sidewall of the second gate structure, wherein an upper surface of the first spacer is in contact with a sidewall of the first gate structure at a first point, wherein an upper surface of the second spacer is in contact with a sidewall of the second gate structure at a second point, wherein at the first point, the upper surface of the first spacer and a sidewall of the first spacer form a first acute angle, and wherein at the second point, the upper surface of the second spacer and a sidewall of the second spacer form a second acute angle larger than the first acute angle.

According to aspects of the present inventive concept, there is provided a method for fabricating a semiconductor device, the method comprising forming, on a substrate, a spacer defining a gate trench, forming, on the substrate, a gate structure filling the gate trench, performing a first etching process having a larger etching rate with respect to the gate structure than the spacer, and after performing the first etching process, performing a second etching process having a larger etching rate with respect to the spacer than the gate structure.

BRIEF DESCRIPTION OF THE DRAWINGS

The above and other aspects and features of the present inventive concept will become more apparent by describing in detail exemplary embodiments thereof with reference to the attached drawings, in which:

FIG. 14B is an enlarged view of a portion R5 of FIG. 13.

FIGS. 15 to 30 are views illustrating intermediate steps of a method for fabricating a semiconductor device according to some exemplary embodiments of the present inventive concept.

FIGS. 31 and 32 are views illustrating intermediate steps of a method for fabricating a semiconductor device according to some exemplary embodiments of the present inventive concept.

DETAILED DESCRIPTION OF THE EMBODIMENTS

Hereinafter, a semiconductor device according to some exemplary embodiments of the present inventive concept will be described with reference to FIGS. 1 to 14B.

Figure 1:
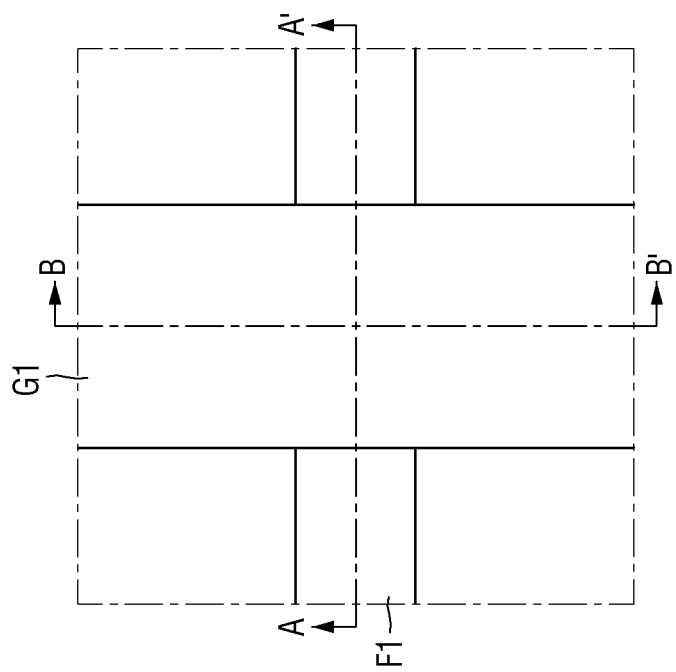
FIG. 1 is a layout diagram illustrating a semiconductor device according to some exemplary embodiments of the present inventive concept.
Figure 2:
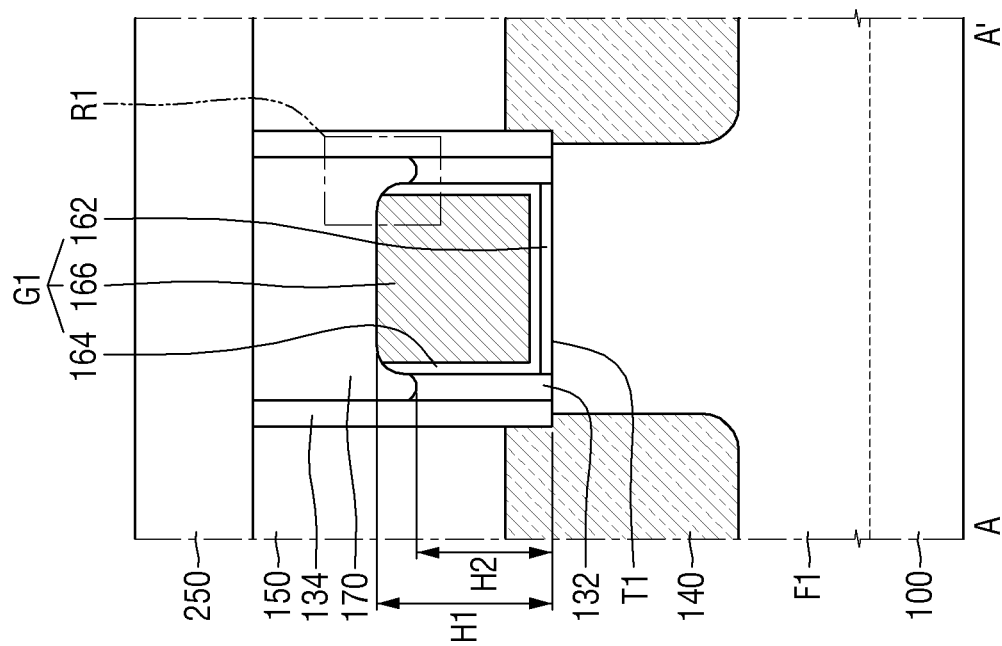
FIG. 2 is a cross-sectional view taken along line A-A' of FIG. 1.
Figure 3:
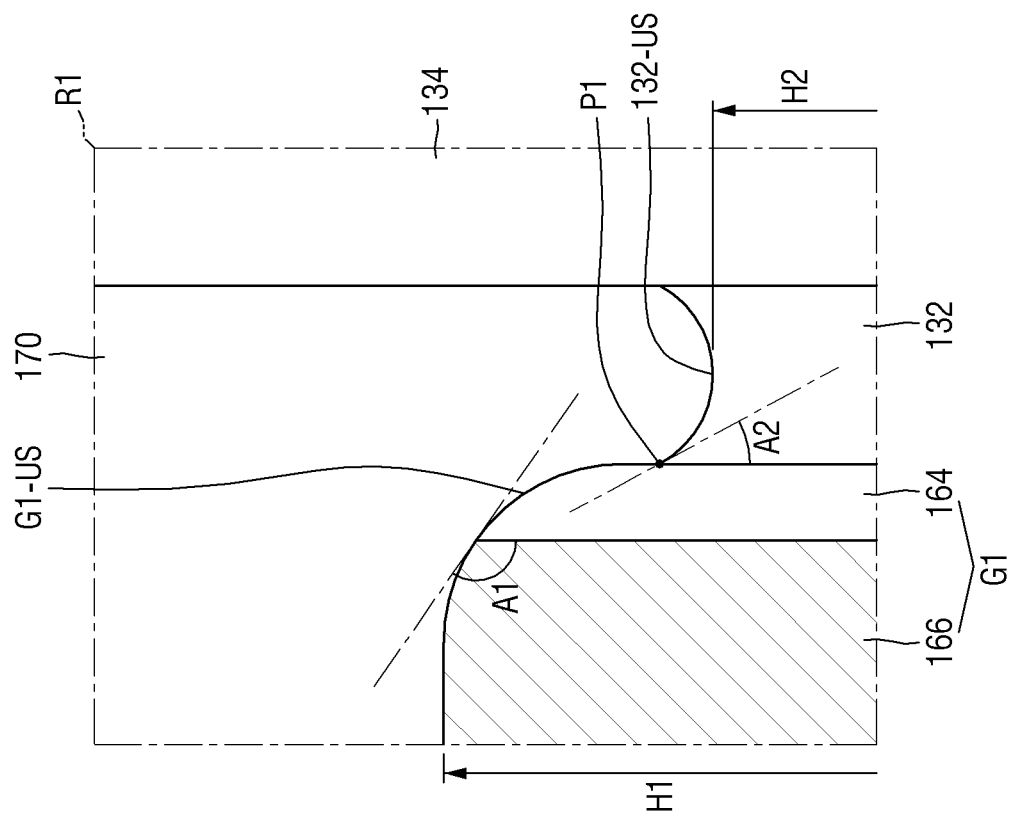
FIG. 3 is an enlarged view of a portion R1 of FIG. 2.
Figure 4:
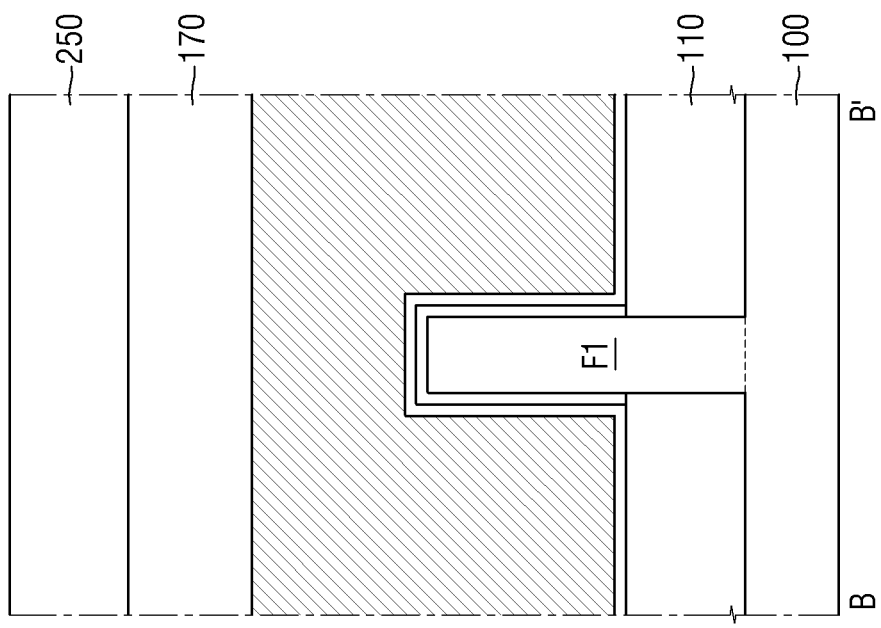
FIG. 4 is a cross-sectional view taken along line B-B' of FIG. 1

FIG. 1 is a layout diagram illustrating a semiconductor device according to some exemplary embodiments of the present inventive concept. FIG. 2 is a cross-sectional view taken along line A-A' of FIG. 1. FIG. 3 is an enlarged view of a portion R1 of FIG. 2. FIG. 4 is a cross-sectional view taken along line B-B' of FIG. 1.

Although the drawings relating to a semiconductor device according to some exemplary embodiments of the present inventive concept illustrate a fin-type transistor (finFET) including a fin-shaped channel region as an example, the present disclosure is not limited thereto. Further, the semiconductor device according to some exemplary embodiments of the present inventive concept may include a tunneling FET, a bipolar junction transistor, a lateral double diffusion transistor (LDMOS) or the like. The semiconductor device may be in the form of, for example, a semiconductor chip or die, formed from a semiconductor wafer. The term "semiconductor device" as used herein may also refer to a semiconductor package, including a package substrate, one or more semiconductor chips, and an encapsulant.

Referring to FIGS. 1 to 4, a semiconductor device according to some exemplary embodiments includes a substrate 100, a field insulating film 110, a first gate structure G1, a first spacer 132, a second spacer 134, a first source/drain region 140, a first capping pattern 170, a first interlayer insulating film 150 and a second interlayer insulating film 250.

The substrate 100 may be, for example, bulk silicon or silicon-on-insulator (SOI). The substrate 100 may be a silicon substrate or it may include other materials such as silicon germanium, indium antimonide, a lead tellurium compound, indium arsenide, indium phosphide, gallium arsenide, or gallium antimonide. Alternatively, the substrate 100 may have an epitaxial layer formed on a base substrate.

The substrate 100 may include a first fin-shaped pattern F1. The first fin-shaped pattern F1 may protrude from the top of the substrate 100 and be elongated. The first fin-shaped pattern F1 may be a portion of the substrate 100 or may include an epitaxial layer grown from the substrate 100.

The first fin pattern F1 may include, for example, silicon or germanium, which is an elemental semiconductor material. Further, the first fin-shaped pattern F1 may include a compound semiconductor, for example, a group IV-V compound semiconductor or a group III-V compound semiconductor.

For example, in the exemplary embodiment where the first fin-shaped pattern F1 includes a group IV-V compound semiconductor, the first fin-shaped pattern F1 may include a binary or ternary compound containing at least two of carbon (C), silicon (Si), germanium (Ge) and tin (Sn), or a compound obtained by doping the compound with a group IV element. For example, in the exemplary embodiment where the first fin-shaped pattern F1 includes a group III-V compound semiconductor, the first fin-shaped pattern F1 may include a binary, ternary or quarternary compound formed by combining at least one of aluminum (Al), gallium (Ga) and indium (In) which are group III elements with one of phosphorus (P), arsenic (As) and antimony (Sb) which are group V elements. In the semiconductor device according to some exemplary embodiments, the first fin-shaped pattern F1 is described as being a silicon fin-shaped pattern including silicon.

The first fin-shaped pattern F1 may be included in the channel region of the transistor including the first gate structure G1. In this specification, the channel region of the transistor including the first gate structure G1 is described as including the first fin-shaped pattern F1, but the present disclosure is not limited thereto. For example, the channel region of the transistor including the first gate structure G1 may include a nanowire pattern, a nanosheet pattern or the like.

The field insulating film 110 may cover a portion of the sidewall of the first fin-shaped pattern F1 on the substrate 100.

The field insulating film 110 may include at least one of an oxide film, a nitride film, an oxynitride film and a combination thereof, but the present disclosure is not limited thereto.

The first gate structure G1 may be formed on the substrate 100. For example, the first gate structure G1 may intersect the first fin-shaped pattern F1 on the first fin-shaped pattern F1.

The first spacer 132 may be formed on the sidewall of the first gate structure G1. Accordingly, the first spacer 132 may intersect the first fin-shaped pattern F1 on the first fin-shaped pattern F1. Also, the first spacer 132 may be in contact with the first gate structure G1. When an element is referred to as "contacting" or "in contact with" another element, there are no intervening elements present.

The first spacer 132 may define a gate trench T1 on the substrate 100. For example, the gate trench T1 defined by the sidewall of the first spacer 132 and the upper surface of the first fin-shaped pattern F1 may be formed. Since the first spacer 132 may intersect the first fin-shaped pattern F1, the gate trench T1 may also intersect the first fin-shaped pattern F1. In this exemplary embodiment, the first gate structure G1 may fill the gate trench T1.

The second spacer 134 may be formed on the sidewall of the first spacer 132. Accordingly, the second spacer 134 may intersect the first fin-shaped pattern F1 on the first fin-shaped pattern F1. In some exemplary embodiments, the upper surface of the second spacer 134 may be formed to be higher than the upper surface of the first gate structure G1 in a direction away from an upper surface of the substrate 100.

Although each of the first spacer 132 and the second spacer 134 is shown as a single film, the present disclosure is not limited thereto, and each of the first spacer 132 and the second spacer 134 may be formed of a multilayer film.

The first spacer 132 and the second spacer 134 may include, for example, at least one of silicon nitride (SiN), silicon oxynitride (SiON), silicon oxide ($SiO_2$), silicon oxynitride (SiOCN) and a combination thereof. In some exemplary embodiments, the first spacer 132 may include silicon oxide and the second spacer 134 may include silicon nitride.

The first gate structure G1 may include a first interface film 162, a first gate insulating film 164 and a first gate electrode 166.

The first interface film 162 may be formed on the upper surface of the first fin-shaped pattern F1. For example, the first interface film 162 may extend along the profile of the bottom surface of the gate trench T1. However, the present disclosure is not limited thereto, and the first interface film 162 may extend along the profile of the bottom surface and the sidewall of the gate trench T1. Further, in some exemplary embodiments, the first interface film 162 may be omitted.

The first interface film 162 may include, for example, silicon oxide ($SiO_2$). However, depending on the type of the substrate 100, the type of the first fin-shaped pattern F1, or the type of the first gate insulating film 164, the first interface film 162 may include other material compositions.

The first gate insulating film 164 may be interposed between the substrate 100 and the first gate electrode 166. For example, the first gate insulating film 164 may be formed on the first interface film 162. For example, the first gate insulating film 164 may extend along the profile of the bottom surface and the sidewall of the gate trench T1 on the first interface film 162. However, the present disclosure is not limited thereto, and the first gate insulating film 164 may extend along the profile of the bottom surface of the gate trench T1.

The first gate insulating film 164 may include, for example, at least one of silicon oxide ($SiO_2$), silicon oxynitride (SiON), silicon nitride (SiN) and a high permittivity material having a dielectric constant higher than that of silicon oxide ($SiO_2$). The high permittivity material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and a combination thereof.

The first gate electrode 166 may be formed in the gate trench T1. For example, the first gate electrode 166 may fill the remaining region of the gate trench T1 after the first interface film 162 and the first gate insulating film 164 are formed. Accordingly, the first gate insulating film 164 may extend along the bottom surface and the sidewall of the first gate electrode 166. For example, a first sidewall of the first spacer 132 contacts a first sidewall of the first gate insulating film 164, a second sidewall of the first spacer 132 opposing the first sidewall of the first spacer 132 contacts a first sidewall of the second spacer 134, the bottom surface of the first gate electrode 166 contacts upper portion of the bottom surface of the first gate insulating film 164 and upper surface of the first interface film 162 contacts lower portion of the bottom surface of the first gate insulating film 164, and uppermost surface of the first fin-shaped pattern F1 contacts lower surface of the first interface film 162. In some embodiments, the lowermost surfaces of the first interface film 162, the first spacer 132, the second spacer 134, and the uppermost surface of the first fin-shaped pattern F1 are arranged on the same plane (i.e., at the same height away from the upper surface of the substrate 100). In some embodiments, where the first interface film 162 is not provided between the first fin-shaped pattern F1 and the first gate electrode 166, the lowermost surfaces of the first gate insulating film 164, the first spacer 132, the second spacer 134, and the uppermost surface of the first fin-shaped pattern F1 are arranged on the same plane (i.e., at the same height away from the upper surface of the substrate 100).

The first gate electrode 166 may include a conductive material. Further, the first gate electrode 166 may be formed by stacking a plurality of conductive materials. For example, the first gate electrode 166 may include a metal layer. For example, the first gate electrode 166 may include at least one of Ti, Ta, W, Al, Co and a combination thereof. Also, for example, the first gate electrode 166 may be made of silicon or silicon germanium instead of metal.

The upper surface of the first gate structure G1 adjacent to the first spacer 132 may be convex. The term "convex" as used herein refers to convexity with respect to an upper surface of the substrate 100. For example, as shown in FIG. 3, the first gate structure G1 may include a first convex upper surface G1-US. The first convex upper surface G1-US of the first gate structure G1 may be adjacent to the sidewall of the first spacer 132. In some exemplary embodiments, the height of the first convex upper surface G1-US of the first gate structure G1 may increase in a direction away from the first spacer 132.

Since the first gate electrode 166 is a portion of the first gate structure G1 filling the gate trench T1, the upper surface of the first gate electrode 166 adjacent to the first spacer 132 may be convex. Accordingly, the height of the upper surface of the first gate electrode 166 adjacent to the first spacer 132 may increase in a direction away from the first spacer 132.

The upper surface of the first gate electrode 166 and the sidewall of the first gate electrode 166 may form a first angle A1 at the point where the upper surface of the first gate electrode 166 meets the sidewall of the first gate electrode 166. In some exemplary embodiments, as shown in FIG. 3, the first angle A1 may be an obtuse angle.

In some exemplary embodiments, the first convex upper surface G1-US of the first gate structure G1 may be formed over the upper surface of the first gate electrode 166 and the upper surface of the first gate insulating film 164. For example, when the first gate insulating film 164 extends along the sidewall of the first gate electrode 166, the upper surface of the first gate insulating film 164 may also be convex.

In FIGS. 2 and 3, the upper surface of the first gate electrode 166 and the upper surface of the first gate insulating film 164 are shown as being continuous, but the present disclosure is not limited thereto. For example, the upper surface of the first gate electrode 166 and the upper surface of the first gate insulating film 164 may be discontinuous due to a difference in etching resistance between the first gate electrode 166 and the first gate insulating film 164.

The upper surface of the first spacer 132 may be in contact with the sidewall of the first gate structure G1. For example, as shown in FIG. 3, at the first point P1 on the sidewall of the first gate structure G1, the upper surface of the first spacer 132 and the first gate structure G1 may be in contact with each other.

In some exemplary embodiments, the height of the lowermost portion of the upper surface of the first spacer 132 may be lower than the height of the first point P1. For example, the upper surface of the first spacer 132 may be concave. The term "concave" as used herein refers to concavity with respect to the upper surface of the substrate 100. For example, as shown in FIG. 3, the first spacer 132 may include a first concave upper surface 132-US.

At the first point P1, the sidewall of the first spacer 132 and the upper surface of the first spacer 132 may form a second angle A2. In some exemplary embodiments, the second angle A2 may be an acute angle.

Throughout the disclosure, any reference to a "height" refers to a height in a direction perpendicular to the upper surface of the substrate 100.

In some exemplary embodiments, the height of the first gate structure G1 may be higher than the height of the first spacer 132. For example, the height of the uppermost portion of the first gate structure G1 may be higher than the height of the lowermost portion of the first spacer 132. For example, as shown in FIGS. 2 and 3, the first height H1 of the first gate structure G1 may be higher than the second height H2 of the first spacer 132. Further, the first height H1 of the first gate structure G1 may be higher than the height of the first point P1.

Thus, the uppermost portion of the first convex upper surface G1-US of the first gate structure G1 may be higher than the lowermost portion of the first concave upper surface 132-US of the first spacer 132.

The first capping pattern 170 may be formed on the first gate structure G1 and the first spacer 132. For example, the first capping pattern 170 may cover the upper surface of the first gate structure G1 and the upper surface of the first spacer 132. The first capping pattern 170 may fill a space formed by the second spacer 134.

The upper surface of the first gate structure G1 adjacent to the first spacer 132 may be convex and the upper surface of the first spacer 132 may be concave. Therefore, the bottom surface of the first capping pattern 170 may have a wavy shape. For example, as shown in FIG. 2, the bottom surface of the first capping pattern 170 adjacent to the sidewall of the second spacer 134 may have a wavy shape.

The first capping pattern 170 may include, for example, at least one of silicon nitride (SiN), silicon oxynitride (SiON), silicon oxide (SiO$_2$), silicon carbonitride (SiCN), silicon oxynitride (SiOCN) and a combination thereof.

The first source/drain region 140 may be formed on the sidewall of the first gate structure G1 on the substrate 100. For example, as shown in FIG. 2, the first source/drain region 140 may be formed on the sidewall of the second spacer 134 on the substrate 100.

The first source/drain region 140 may include an epitaxial layer formed on the first fin-shaped pattern F1. Further, the first source/drain region 140 may be raised source and drain regions including an upper surface protruding above the upper surface of the substrate 100. For example, the uppermost surface of the first source/drain region 140 may be arranged at a position higher than the lowermost surfaces of the first interface film 162, the first spacer 132, the second spacer 134, and the uppermost surface of the first fin-shaped pattern F1, but lower than the concave portion of the upper surface of the first spacer 132 in a direction perpendicular to the upper surface of the substrate 100. However, the present disclosure is not limited thereto, and the first source/drain region 140 may be an impurity region formed in the substrate 100.

The first interlayer insulating film 150 may be formed on the substrate 100. In addition, the first interlayer insulating film 150 may cover the sidewall of the second spacer 134.

In FIG. 2, it has been illustrated that the upper surface of the first capping pattern 170, the upper surface of the second spacer 134 and the upper surface of the first interlayer insulating film 150 are arranged on the same plane. However, the present disclosure is not limited thereto.

The second interlayer insulating film 250 may be formed on the first interlayer insulating film 150. For example, the second interlayer insulating film 250 may cover the upper surface of the first capping pattern 170, the upper surface of the second spacer 134 and the upper surface of the first interlayer insulating film 150.

The first interlayer insulating film 150 and the second interlayer insulating film 250 may include at least one of silicon oxide (SiO$_2$), silicon nitride (SiN), silicon oxynitride (SiON) and a low dielectric constant material. However, in some exemplary embodiments, the first interlayer insulating film 150 may include a different material composition from the first spacer 132.

Figure 5:
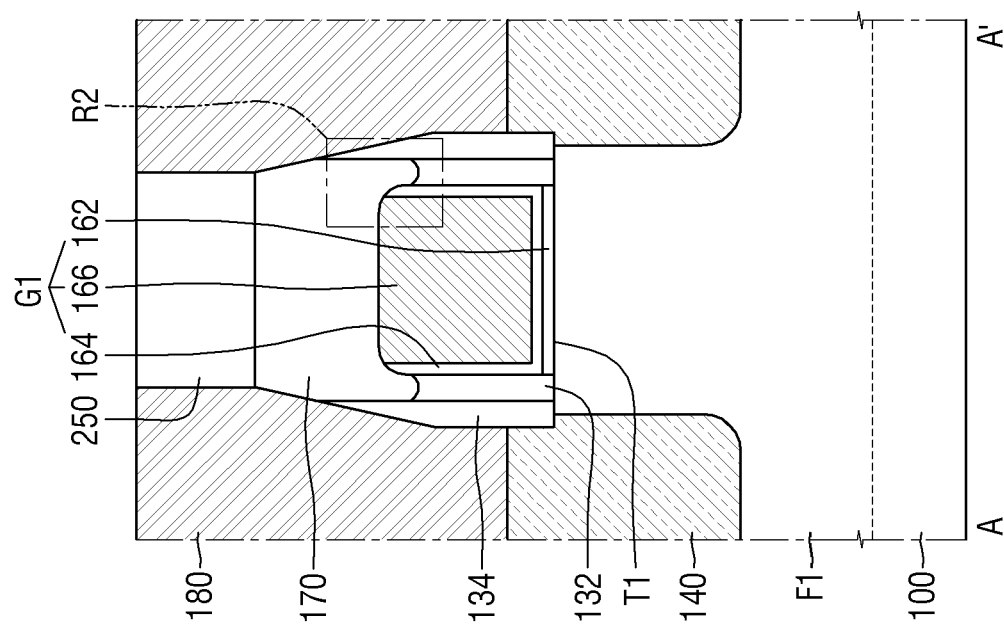
FIG. 5 is a cross-sectional view illustrating a semiconductor device according to some exemplary embodiments of the present inventive concept.
Figure 6:
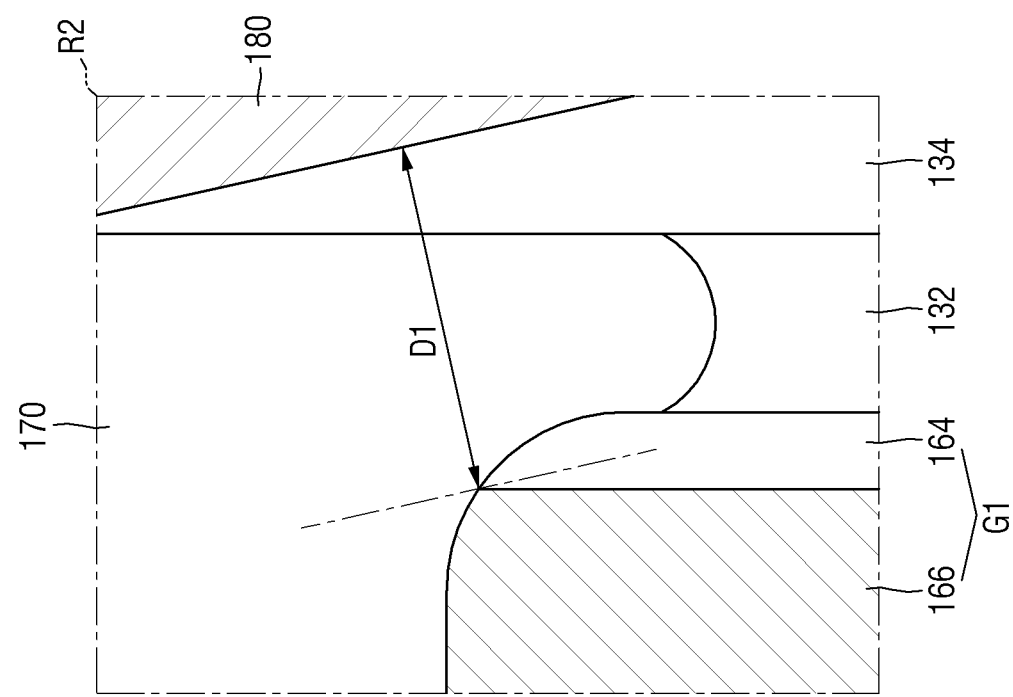
FIG. 6 is an enlarged view of a portion R2 of FIG. 5.

FIG. 5 is a cross-sectional view illustrating a semiconductor device according to some exemplary embodiments of the present inventive concept. FIG. 6 is an enlarged view of a portion R2 of FIG. 5. For simplicity of description, a repeated description similar to the description with reference to FIGS. 1 to 4 will be briefly described or omitted.

Referring to FIGS. 5 and 6, a semiconductor device according to some exemplary embodiments further includes a contact 180.

The contact 180 may be in contact with the first source/drain region 140 on the first source/drain region 140. In addition, the contact 180 may be in contact with the first capping pattern 170 and the second spacer 134. However, in some exemplary embodiments, the contact 180 may not be in contact with the first spacer 132.

The contact 180 may be formed by, for example, a Self-Aligned Contact (SAC) process. Accordingly, the sidewall of the contact 180 may be defined by the sidewall of the first capping pattern 170 or the sidewall of the second spacer 134. This will be described later in detail with reference to FIG. 30.

In some exemplary embodiments, the first spacer 132 may include a low-k material. Accordingly, the first spacer 132 can reduce the parasitic capacitance between the first gate electrode 166 and the contact 180.

Hereinafter, effects of the semiconductor device according to some exemplary embodiments of the present inventive concept will be described with reference to FIGS. 5 to 8.

Figure 7:
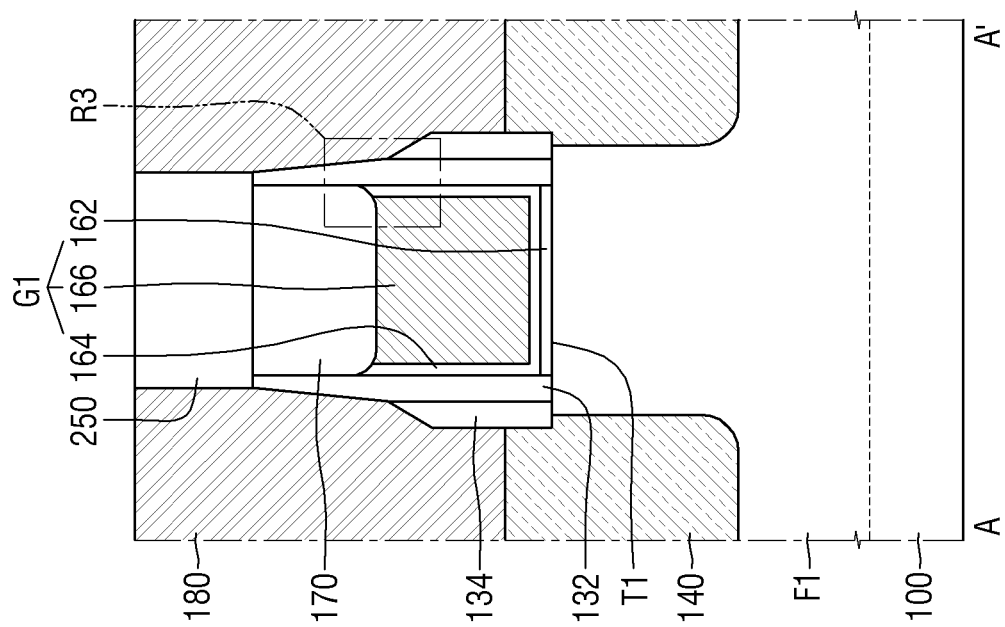
FIG. 7 is a cross-sectional view explaining the effects of the semiconductor device according to some exemplary embodiments of the present inventive concept.
Figure 8:
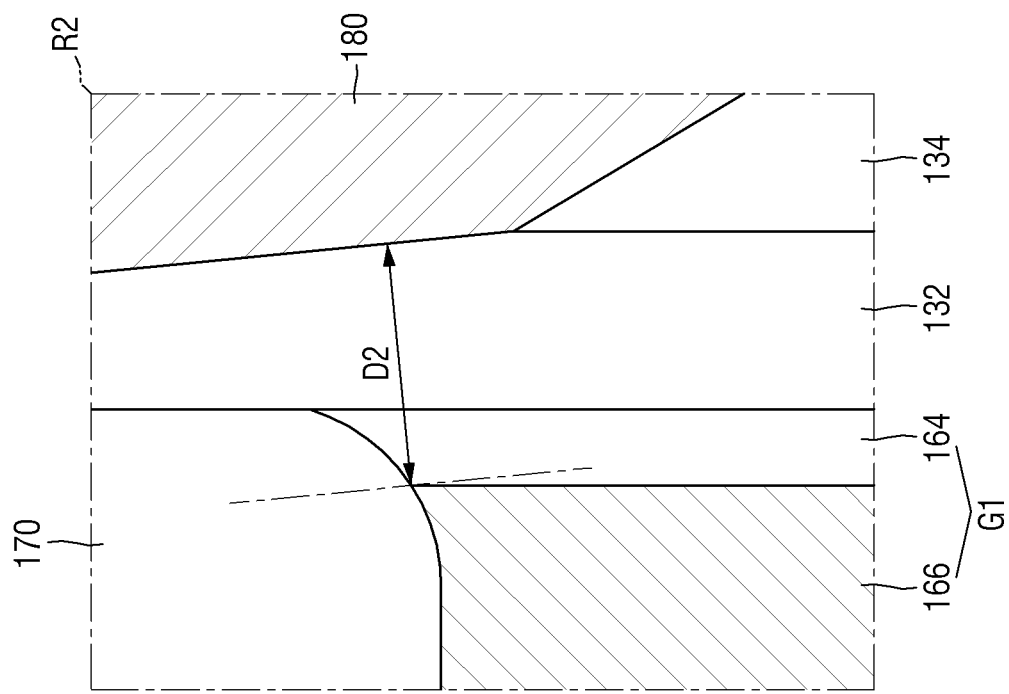
FIG. 8 is an enlarged view of a portion R3 of FIG. 7.

FIG. 7 is a cross-sectional view explaining the effects of the semiconductor device according to some exemplary embodiments of the present inventive concept. FIG. 8 is an enlarged view of a portion R3 of FIG. 7. For simplicity of description, a repeated description similar to the description with reference to FIGS. 1 to 4 will be briefly described or omitted.

Referring to FIGS. 7 and 8, the upper surface of the first gate structure G1 adjacent to the first spacer 132 may include a cusp. For example, the upper surface of the first gate structure G1 may be concave. For example, the upper surface of the first gate electrode 166 adjacent to the first spacer 132 may include a cusp.

The gate electrode including a cusp is apt to generate a leakage current. For example, the first gate electrode 166 of FIG. 7 including a cusp narrows the distance to the contact 180, which tends to generate a leakage current. Further, the cusp of the first gate electrode 166 of FIG. 7 may form a strong magnetic field with the contact 180 due to a sharp shape. These cause a reduction in reliability of the semiconductor device.

However, in the semiconductor device according to some exemplary embodiments, since the upper surface of the gate electrode adjacent to the spacer is convex, the reliability of the semiconductor device can be improved.

For example, since the first gate electrode 166 of FIG. 6 includes the first convex upper surface G1-US, a first distance D1 between the first gate electrode 166 and the contact 180 in FIG. 6 may be greater than a second distance D2 between the first gate electrode 166 and the contact 180 in FIG. 8. For example, the semiconductor device according to some exemplary embodiments can ensure a sufficient distance between the gate electrode and the contact, thereby reducing the leakage current.

Further, since the first gate electrode 166 of FIG. 6 does not include a cusp of a sharp shape, it is possible to prevent the formation of a strong magnetic field generated at the cusp of the gate electrode.

Referring again to FIGS. 7 and 8, the upper surface of the first spacer 132 may be higher than the upper surface of the first gate structure G1. In this exemplary embodiment, a leakage current tends to be generated between the first gate electrode 166 and the contact 180.

For example, in the exemplary embodiment where the first spacer 132 includes silicon oxide ($SiO_2$) and the second spacer 134 includes silicon nitride (SiN), the first spacer 132 may have a smaller etching resistance than the second spacer 134. Thus, for example, in a process of forming a contact hole CH (see FIG. 30) to be described later, the first spacer 132 is more likely to be etched than the second spacer 134. This may cause a narrowing of the distance between the first gate electrode 166 and the contact 180.

However, the upper surface of the first spacer 132 of the semiconductor device according to some exemplary embodiments may be lower than the upper surface of the first gate structure G1. For example, the upper surface of the first spacer 132 in FIGS. 5 and 6 may be lower than the upper surface of the first gate structure G1. Accordingly, in the process of forming the contact hole CH (see FIG. 30), the first spacer 132 may not be etched.

Figure 9:
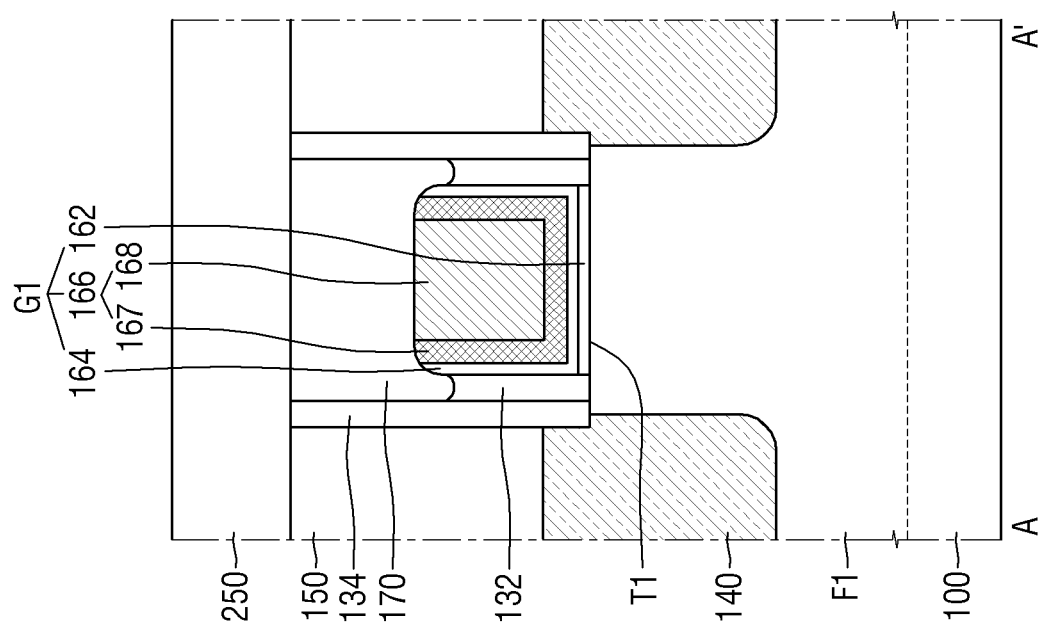
FIG. 9 is a cross-sectional view illustrating a semiconductor device according to some exemplary embodiments of the present inventive concept.

FIG. 9 is a cross-sectional view illustrating a semiconductor device according to some exemplary embodiments of the present inventive concept. For simplicity of description, a repeated description similar to the description with reference to FIGS. 1 to 4 will be briefly described or omitted.

Referring to FIG. 9, the first gate electrode 166 of the semiconductor device according to some exemplary embodiments may be formed of a multilayer film.

For example, the first gate electrode 166 may include a first conductive film 167 and a second conductive film 168.

The first conductive film 167 of the first gate electrode 166 may extend along the bottom surface and the sidewall of the gate trench T1. For example, the first conductive film 167 may extend along the profile of the first gate insulating film 164.

The first conductive film 167 may adjust a work function. The second conductive film 168 of the first gate electrode 166 may fill a space formed by the first conductive film 167.

The first conductive film 167 may include, for example, at least one of TiN, TaN, TiC, TaC, TiAlC and a combination thereof. The second conductive film 168 may include, for example, W or Al.

Figure 10:
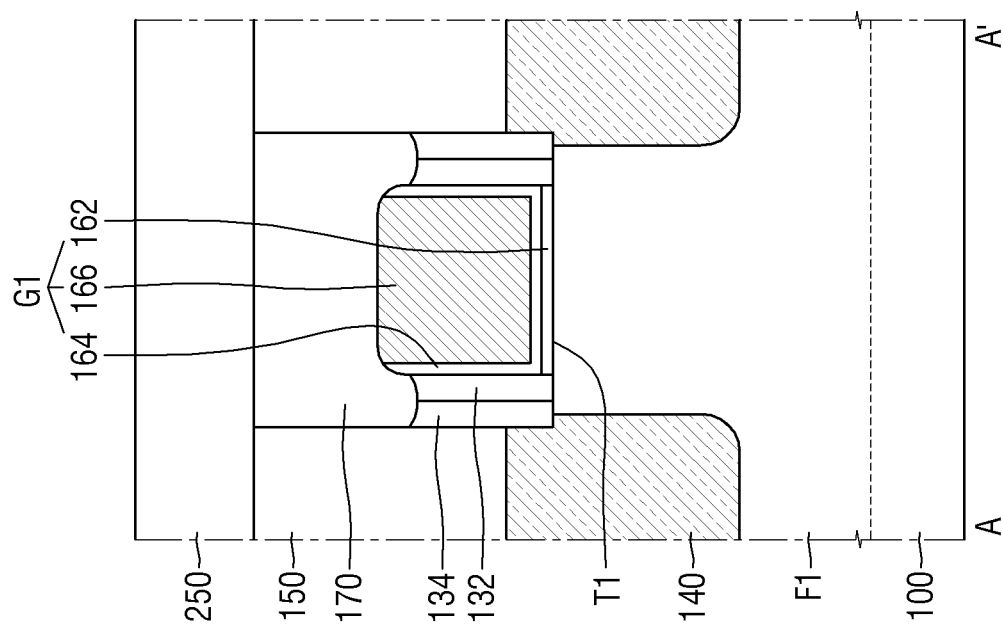
FIG. 10 is a cross-sectional view illustrating a semiconductor device according to some exemplary embodiments of the present inventive concept.

FIG. 10 is a cross-sectional view illustrating a semiconductor device according to some exemplary embodiments of the present inventive concept. For simplicity of description, a repeated description similar to the description with reference to FIGS. 1 to 4 will be briefly described or omitted.

Referring to FIG. 10, in the semiconductor device according to some exemplary embodiments, the upper surface of the second spacer 134 may be concave. Further, the height of the second spacer 134 may be lower than the height of the first gate structure G1.

In FIG. 10, the upper surface of the first spacer 132 and the upper surface of the second spacer 134 are shown as being continuous, but the present disclosure is not limited thereto. For example, due to a difference in etching resistance between the first spacer 132 and the second spacer 134, the upper surface of the first spacer 132 and the upper surface of the second spacer 134 may be discontinuous. Further, the upper surface of the second spacer 134 may be in contact with the sidewall of the first interlayer insulating film 150.

In this exemplary embodiment, the first capping pattern 170 may cover not only the upper surface of the first gate structure G1 and the upper surface of the first spacer 132, but also the upper surface of the second spacer 134. Accordingly, the first capping pattern 170 may fill a space formed by the first interlayer insulating film 150.

Figure 11:
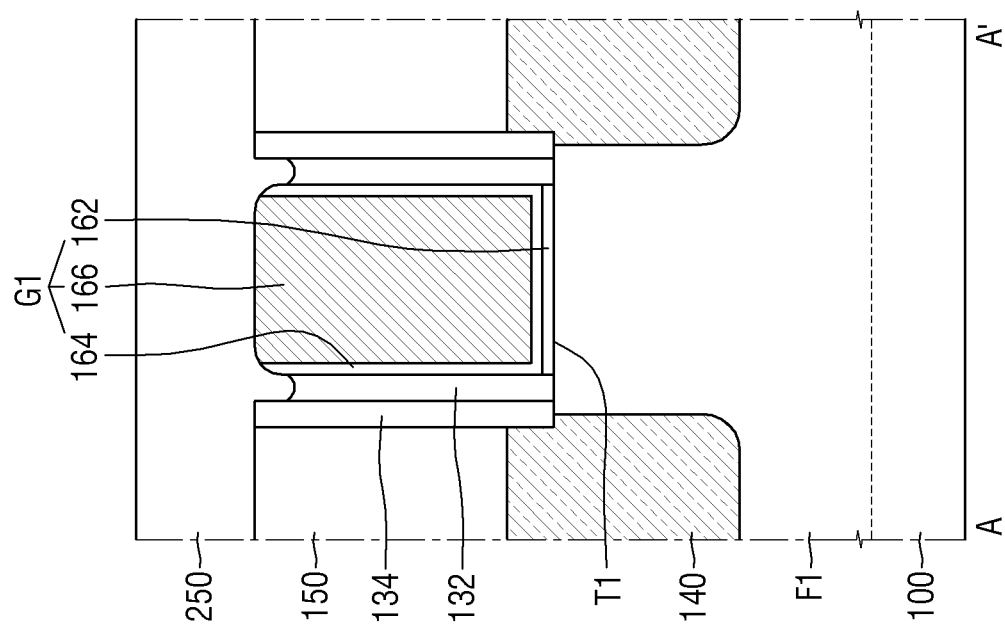
FIG. 11 is a cross-sectional view illustrating a semiconductor device according to some exemplary embodiments of the present inventive concept.

FIG. 11 is a cross-sectional view illustrating a semiconductor device according to some exemplary embodiments of the present inventive concept. For simplicity of description, a repeated description similar to the description with reference to FIGS. 1 to 4 will be briefly described or omitted.

Referring to FIG. 11, the semiconductor device according to some exemplary embodiments does not include the first capping pattern 170.

Thus, the second interlayer insulating film 250 may cover the upper surface of the first gate structure G1 and the upper surface of the first spacer 132.

The upper surface of the first gate structure G1 adjacent to the first spacer 132 may be convex and the upper surface of the first spacer 132 may be concave. Accordingly, the bottom surface of the second interlayer insulating film 250 may have a wavy shape. For example, as illustrated, the bottom surface of the second interlayer insulating film 250 adjacent to the sidewall of the second spacer 134 may have a wavy shape.

Figure 12:
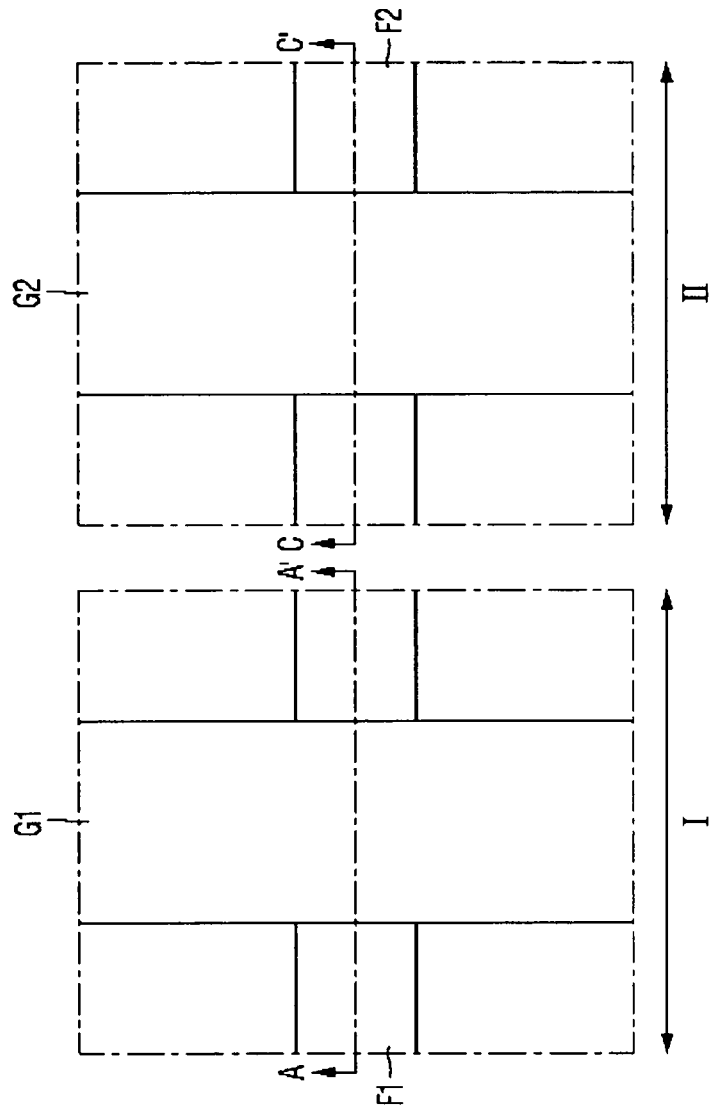
FIG. 12 is a layout diagram explaining a semiconductor device according to some exemplary embodiments of the present inventive concept.
Figure 13:
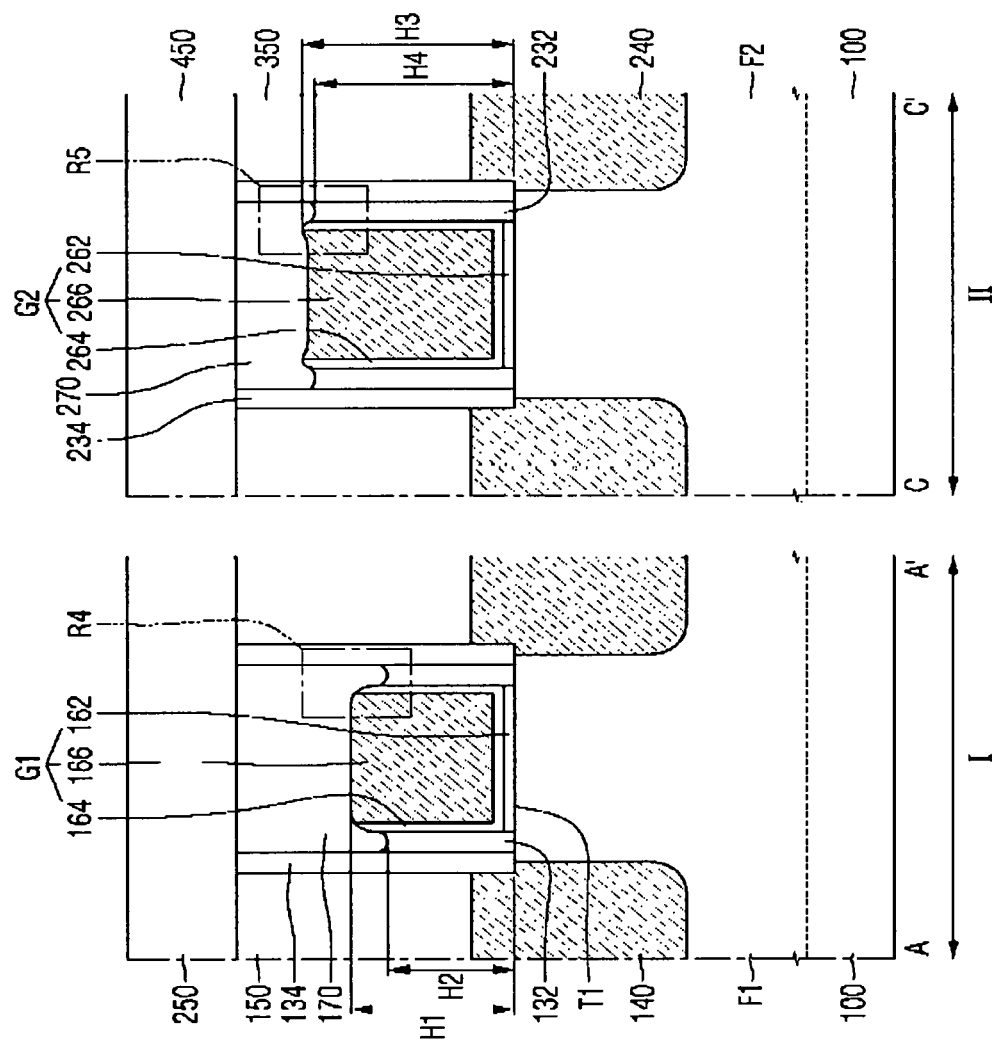
FIG. 13 is a cross-sectional view taken along lines A-A' and C-C' of FIG. 12.
Figure 14A:
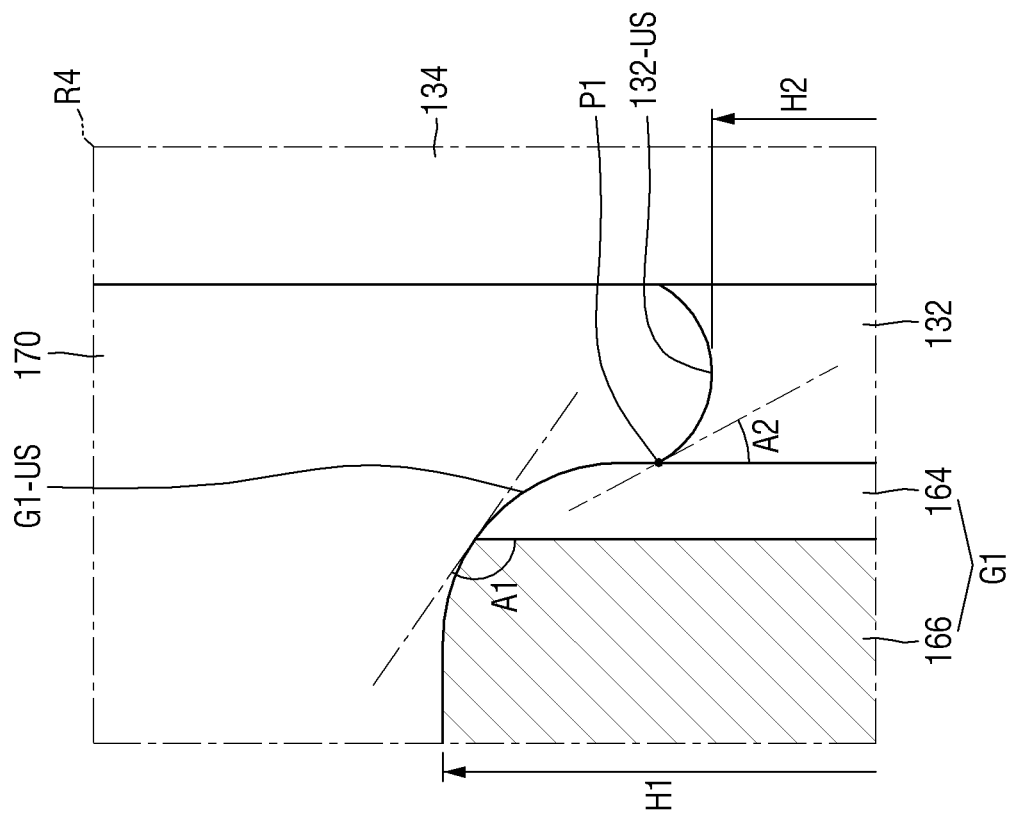
FIG. 14A is an enlarged view of a portion R4 of FIG. 13.

FIG. 12 is a layout diagram explaining a semiconductor device according to some exemplary embodiments of the present inventive concept. FIG. 13 is a cross-sectional view taken along lines A-A' and C-C' of FIG. 12. FIG. 14A is an enlarged view of a portion R4 of FIG. 13. FIG. 14B is an enlarged view of a portion R5 of FIG. 13. For simplicity of description, a repeated description similar to the description with reference to FIGS. 1 to 4 will be briefly described or omitted.

Referring to FIGS. 12 to 14B, in the semiconductor device according to some exemplary embodiments, the substrate 100 includes a first region I and a second region II.

The first region I and the second region II may be separated from each other or may be connected to each other. It will be understood that when an element is referred to as being "connected" or "coupled" to or "on" another element, it can be directly connected or coupled to or on the other element or intervening elements may be present.

In the semiconductor device according to some exemplary embodiments, transistors of different conductivity types may be formed in the first region I and the second region II. For example, the first region I may be a region where an NMOS transistor is formed, and the second region II may be a region where a PMOS transistor is formed. Conversely, the first region I may be a region where a PMOS transistor is formed, and the second region II may be a region where an NMOS transistor is formed.

Since the first region I of the substrate 100 is substantially the same as that described with reference to FIGS. 1 to 4, a detailed description will be omitted below.

In the second region II of the substrate 100, a second gate structure G2, a third spacer 232, a fourth spacer 234, a second source/drain region 240, a second capping pattern 270, a third interlayer insulating film 350 and a fourth interlayer insulating film 450 may be formed.

In the second region II, the substrate 100 may include a second fin-shaped pattern F2. The second fin-shaped pattern F2 may protrude from the top of the substrate 100 and be elongated. The first fin-shaped pattern F1 and the second fin-shaped pattern F2 may extend in the same direction or in different directions.

The second gate structure G2 may be formed on the substrate 100. For example, the second gate structure G2 may intersect the second fin-shaped pattern F2 on the second fin-shaped pattern F2.

The third spacer 232 may be formed on the sidewall of the second gate structure G2. Also, the third spacer 232 may be in contact with the second gate structure G2.

The fourth spacer 234 may be formed on the sidewall of the third spacer 232.

The second gate structure G2 may include a second interface film 262, a second gate insulating film 264 and a second gate electrode 266.

The upper surface of the second gate structure G2 adjacent to the third spacer 232 may be convex. For example, as shown in FIG. 14B, the second gate structure G2 may include a second convex upper surface G2-US. The second convex upper surface G2-US of the second gate structure G2 may be adjacent to the sidewall of the third spacer 232. In some exemplary embodiments, the height of the second convex upper surface G2-US of the second gate structure G2 may increase and then decrease in a direction away from the third spacer 232.

The upper surface of the second gate electrode 266 and the sidewall of the second gate electrode 266 may form a third angle A3 at the point where the upper surface of the second gate electrode 266 meets the sidewall of the second gate electrode 266. In some exemplary embodiments, as shown in FIG. 14B, the third angle A3 may be an acute angle. However, the present disclosure is not limited thereto, and the third angle A3 may be an obtuse angle.

However, in some exemplary embodiments, the third angle A3 may be smaller than the first angle A1. For example, a radius of curvature of the second convex upper surface G2-US may be smaller than a radius of curvature of the first convex upper surface G1-US.

In some exemplary embodiments, the second convex upper surface G2-US of the second gate structure G2 may be formed over the upper surface of the second gate electrode 266 and the upper surface of the second gate insulating film 264.

In FIGS. 13 and 14B, the upper surface of the first gate electrode 166 and the upper surface of the first gate insulating film 164 are shown as being continuous, but the present disclosure is not limited thereto.

The upper surface of the third spacer 232 may be in contact with the sidewall of the second gate structure G2. For example, as shown in FIG. 14B, at the second point P2 on the sidewall of the second gate structure G2, the upper surface of the third spacer 232 and the second gate structure G2 may be in contact with each other.

In some exemplary embodiments, the height of the lowermost portion of the upper surface of the third spacer 232 may be smaller than the height of the second point P2. For example, the upper surface of the third spacer 232 may be concave. For example, as shown in FIG. 14B, the third spacer 232 may include a second concave upper surface 232-US.

At the second point P2, the sidewall of the third spacer 232 and the upper surface of the third spacer 232 may form a fourth angle A4. In some exemplary embodiments, the fourth angle A4 may be an acute angle.

However, in some exemplary embodiments, the fourth angle A4 may be greater than the second angle A2. For example, a radius of curvature of the second concave upper surface 232-US may be greater than a radius of curvature of the first concave upper surface 132-US.

In some exemplary embodiments, the height of the second gate structure G2 may be higher than the height of the third spacer 232. For example, the height of the uppermost portion of the first gate structure G1 may be higher than the height of the lowermost portion of the first spacer 132. For example, as shown in FIGS. 13 and 14B, a third height H3 of the second gate structure G2 may be higher than a fourth height H4 of the third spacer 232. Also, the third height H3 of the second gate structure G2 may be higher than the height of the second point P2.

Thus, the uppermost portion of the second convex upper surface G2-US of the second gate structure G2 may be higher than the lowermost portion of the second concave upper surface 232-US of the third spacer 232.

However, in some exemplary embodiments, the third height H3 of the second gate structure G2 may be higher than the first height H1 of the first gate structure G1. Further, in some exemplary embodiments, the fourth height of the third spacer 232 may be higher than the second height H2 of the first spacer 132.

The second capping pattern 270 may be formed on the second gate structure G2 and the third spacer 232.

Since the upper surface of the second gate structure G2 adjacent to the third spacer 232 may be convex and the upper surface of the third spacer 232 may be concave, the bottom surface of the second capping pattern 270 may have a wavy shape. For example, as shown in FIG. 13, the bottom surface of the second capping pattern 270 adjacent to the sidewall of the third spacer 232 may have a wavy shape.

The second source/drain region 240 may be formed on the sidewall of the second gate structure G2 on the substrate 100.

The third interlayer insulating film 350 may be formed on the substrate 100. Further, the third interlayer insulating film 350 may cover the sidewall of the fourth spacer 234.

The fourth interlayer insulating film 450 may be formed on the third interlayer insulating film 350. For example, the fourth interlayer insulating film 450 may cover the upper surface of the second capping pattern 270, the upper surface of the third spacer 232 and the upper surface of the third interlayer insulating film 350.

Hereinafter, a method for fabricating a semiconductor device according to some exemplary embodiments of the present inventive concept will be described with reference to FIGS. 5 and 15 to 32.

FIGS. 15 to 30 are views illustrating intermediate steps of a method for fabricating a semiconductor device according to some exemplary embodiments of the present inventive concept. For simplicity of description, a repeated description similar to the description with reference to FIGS. 1 to 14B will be briefly described or omitted.

Referring to FIG. 15, a dummy gate structure DG is formed on the substrate 100.

First, the first fin-shaped pattern F1 may be formed on the substrate 100. The first fin-shaped pattern F1 may be a portion of the substrate 100 or may include an epitaxial layer grown from the substrate 100.

Then, an insulating film and a conductive film are sequentially formed on the substrate 100 and the first fin-shaped pattern F1, and the insulating film and the conductive film may be patterned to form a dummy gate insulating film 122 and a dummy gate electrode 124 intersecting the first fin-shaped pattern F1. Thus, the dummy gate structure DG including the dummy gate insulating film 122 and the dummy gate electrode 124 may be formed.

Figure 16:
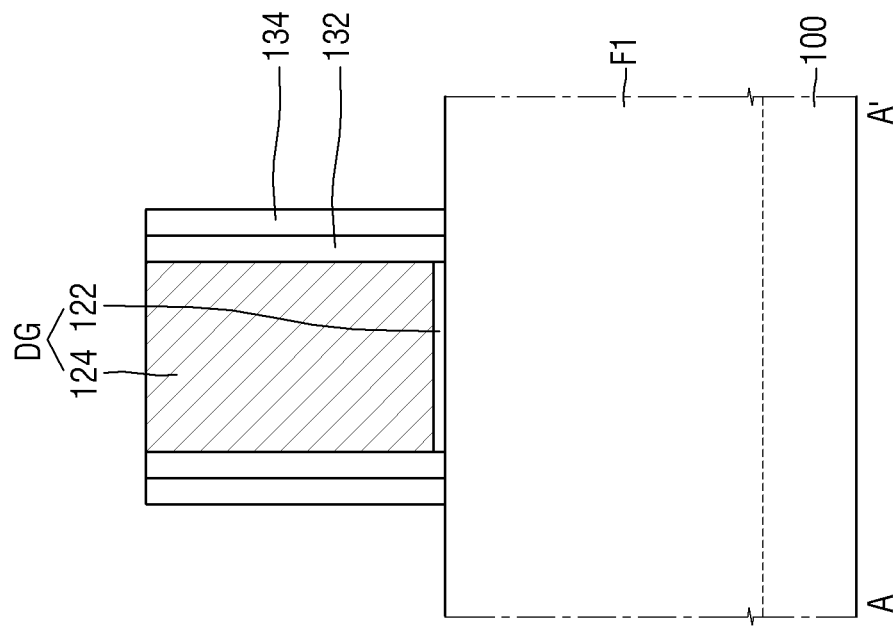

Referring to FIG. 16, the first spacer 132 and the second spacer 134 are formed on the sidewall of the dummy gate structure DG.

The first spacer 132 may be formed on both sidewalls of the dummy gate structure DG. The second spacer 134 may be formed on the sidewall of the first spacer 132.

Although each of the first spacer 132 and the second spacer 134 is shown as a single film, the present disclosure is not limited thereto, and each of the first spacer 132 and the second spacer 134 may be formed of a multilayer film.

The first spacer 132 and the second spacer 134 may include, for example, at least one of silicon nitride (SiN), silicon oxynitride (SiON), silicon oxide (SiO$_2$), silicon oxynitride (SiOCN) and a combination thereof. In some exemplary embodiments, the first spacer 132 may include silicon oxide and the second spacer 134 may include silicon nitride.

Figure 17:
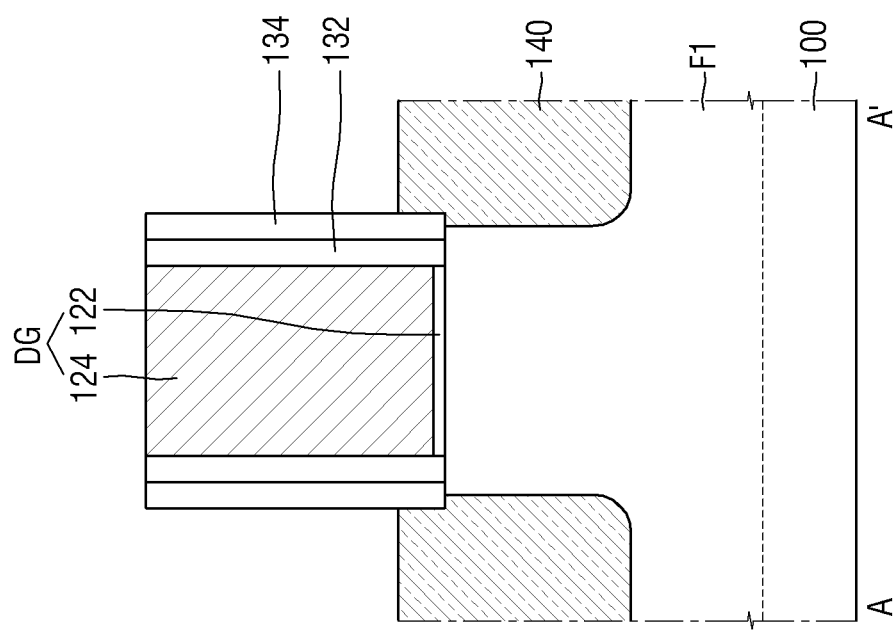

Referring to FIG. 17, the first source/drain region 140 is formed on the substrate 100.

The first source/drain region 140 may be formed on the sidewall of the first gate structure G1 on the substrate 100.

For example, the first source/drain region 140 may include an epitaxial layer formed on the first fin-shaped pattern F1. Further, the first source/drain region 140 may be raised source and drain regions including an upper surface protruding above the upper surface of the substrate 100.

For example, a portion of the first fin-shaped pattern F1 may be etched by using an etching process using the first gate structure G1, the first spacer 132 and the second spacer 134 as an etching mask. Then, the first source/drain region 140 may be formed in the etched first fin-shaped pattern F1 by using epitaxial growth.

Figure 18:
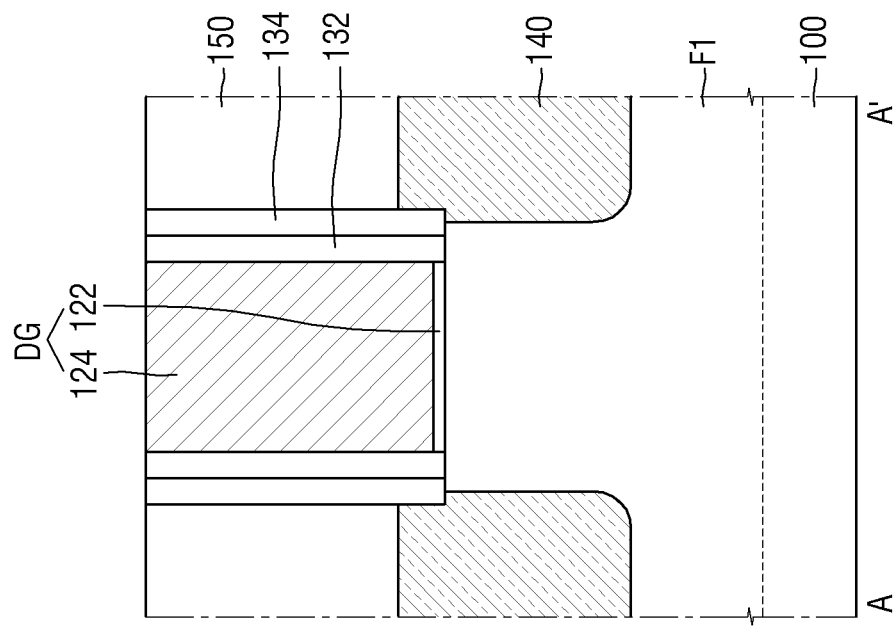

Referring to FIG. 18, the first interlayer insulating film 150 is formed on the substrate 100.

The first interlayer insulating film 150 may be formed to surround the sidewall of the second spacer 134. For example, the first interlayer insulating film 150 may be formed on the resultant structure of FIG. 17, and a planarization process may be performed. The planarization process may include, for example, a chemical mechanical polishing (CMP) process.

Thus, the upper surface of the dummy gate structure DG, the upper surface of the second spacer 134 and the upper surface of the first interlayer insulating film 150 may be arranged on the same plane, but the present disclosure is not limited thereto.

Figure 19:
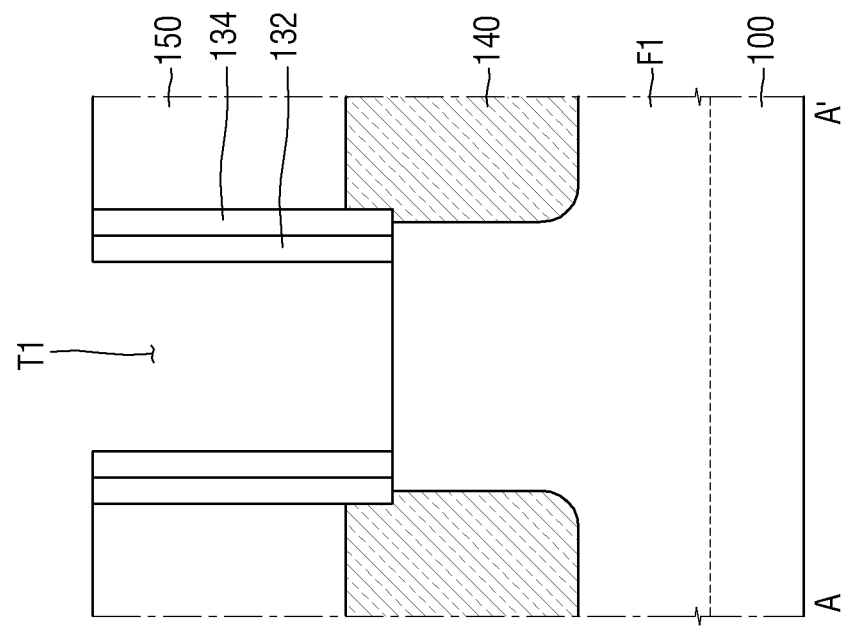

Referring to FIG. 19, the dummy gate structure DG is removed.

Thus, the gate trench T1 may be formed in a region from which the dummy gate structure DG is removed. For example, the gate trench T1 defined by the sidewall of the first spacer 132 and the upper surface of the first fin-shaped pattern F1 may be formed.

Figure 20:
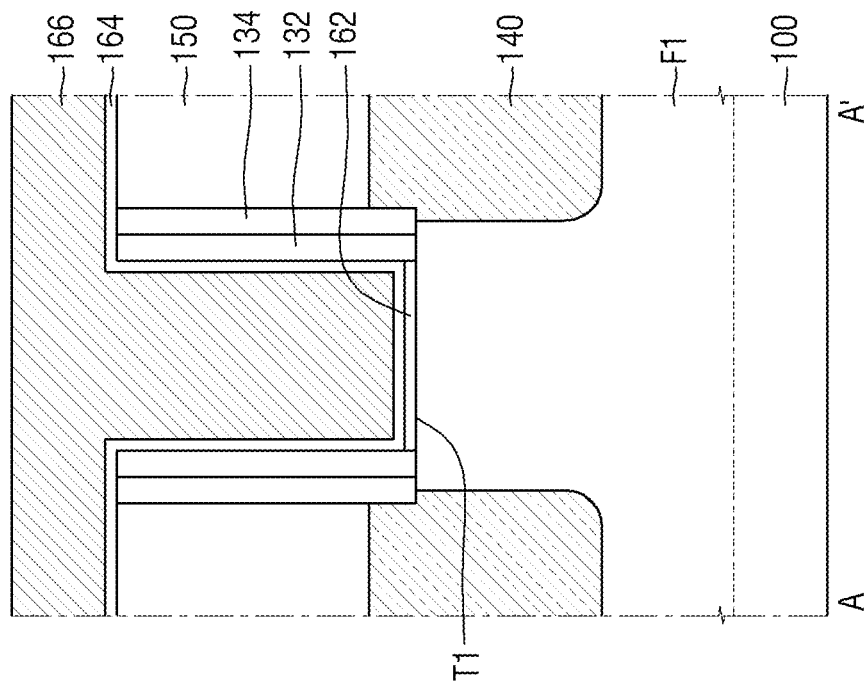

Referring to FIG. 20, the first interface film 162, the first gate insulating film 164 and the first gate electrode 166 are sequentially formed in the gate trench T1.

First, the first interface film 162 may be formed to extend along the bottom surface of the gate trench T1. Then, the first gate insulating film 164 may be formed to extend along the profile of the upper surface of the first interlayer insulating film 150, the upper surface of the second spacer 134, the upper surface of the first spacer 132, the sidewall of the first spacer 132 and the upper surface of the first interface film 162.

Then, the first gate electrode 166 may be formed on the first gate insulating film 164. The first gate electrode 166 may fill a space formed by the first gate insulating film 164.

Figure 21:
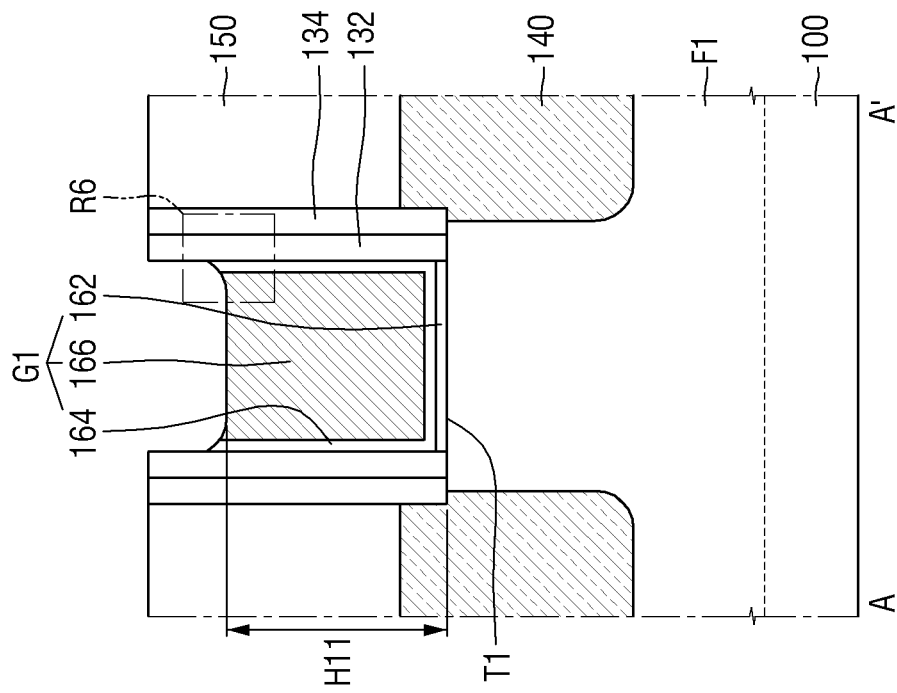
Figure 22:
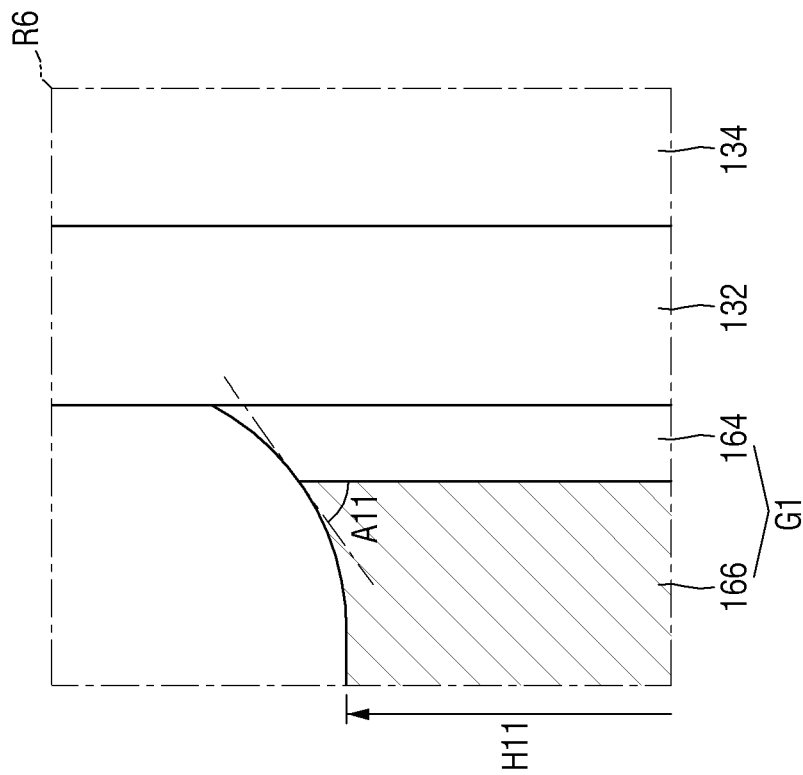

Referring to FIGS. 21 and 22, a first etching process having a larger etching rate with respect to the first gate structure G1 than the first spacer 132 is performed.

The first etching process may be performed until the upper surface of the first gate structure G1 becomes lower than the upper surface of the first spacer 132. Thus, as illustrated, a fifth height H11 of the first gate structure G1 may be lower than the height of the first spacer 132.

However, in some exemplary embodiments, the second spacer 134 and the first interlayer insulating film 150 may not be etched while the first etching process is performed.

The first etching process may include, for example, a reactive ion etching (RIE) process or a wet etching process, but the present disclosure is not limited thereto.

However, due to the nature of the etching process, the upper surface of the first gate structure G1 adjacent to the first spacer 132 may include a cusp. For example, as shown in FIG. 22, after the first etching process is performed, the upper surface of the first gate structure G1 may be concave.

For example, the upper surface of the first gate electrode 166 adjacent to the first spacer 132 may include a cusp. For example, the upper surface of the first gate electrode 166 and the sidewall of the first gate electrode 166 may form a fifth angle A11 which is an acute angle at the point where the upper surface of the first gate electrode 166 meets the sidewall of the first gate electrode 166.

Figure 23:
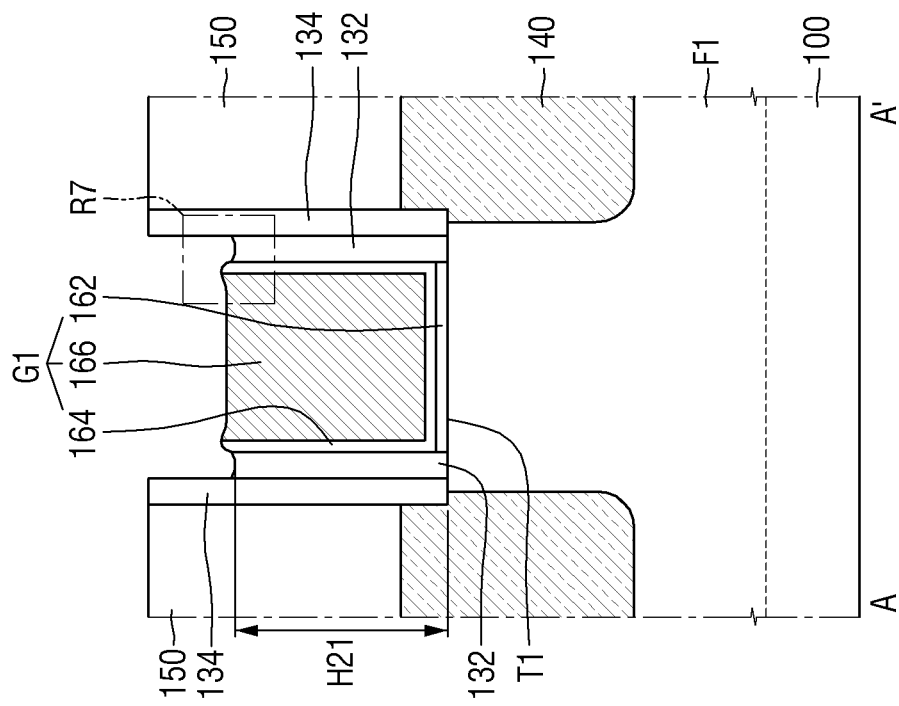
Figure 24:
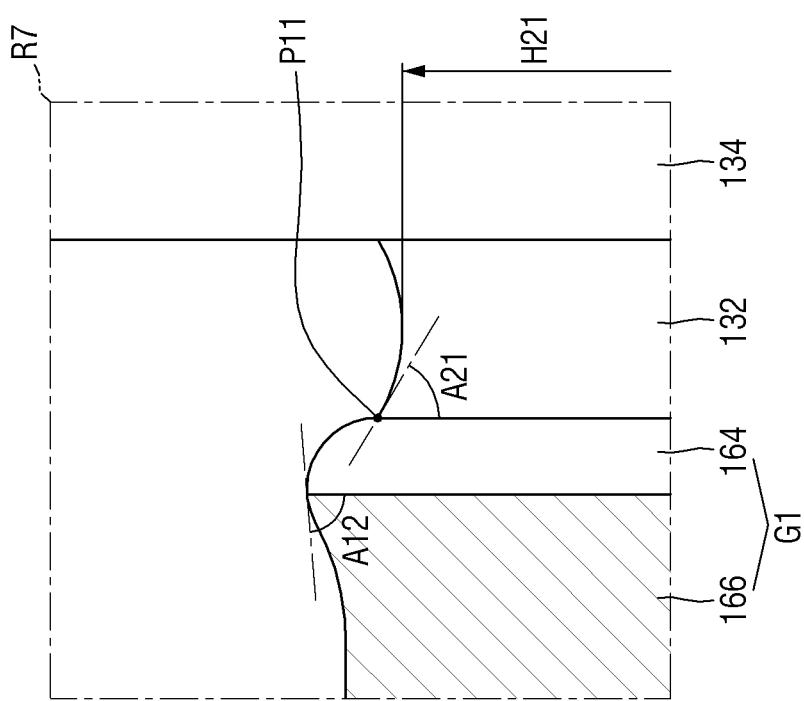

Referring to FIGS. 23 and 24, after performing the first etching process, a second etching process having a larger etching rate with respect to the first spacer 132 than the first gate structure G1 is performed.

The second etching process may be performed until the upper surface of the first spacer 132 is in contact with the sidewall of the first gate structure G1. Thus, as illustrated, at a third point P11 on the sidewall of the first gate structure G1, the upper surface of the first spacer 132 may be in contact with the first gate structure G1.

The second etching process may include, for example, a reactive ion etching (RIE) process or a wet etching process, but the present disclosure is not limited thereto.

In some exemplary embodiments, the second etching process may be performed until the upper surface of the first spacer 132 becomes lower than the upper surface of the first gate structure G1, but the present disclosure is not limited thereto.

By the second etching process, the cusp of the first gate electrode 166 may be gentle. For example, at the point where the upper surface of the first gate electrode 166 meets the sidewall of the first gate electrode 166, the upper surface of the first gate electrode 166 and the sidewall of the first gate electrode 166 may form a sixth angle A12 larger than the fifth angle A11 of FIG. 22.

In FIG. 24, although the sixth angle A12 is shown as an acute angle, the present disclosure is not limited thereto. For example, depending on the etching rate of the second etching process, the sixth angle A12 may be a right angle or an obtuse angle.

Further, due to the nature of the etching process, the upper surface of the first spacer 132 may be concave. Accordingly, the height of the lowermost portion of the upper surface of the first spacer 132 may be lower than the height of the third point P11. For example, as shown in FIG. 24, a sixth height H21 of the first spacer 132 may be lower than the height of the third point P11. Further, for example, at the third point P11, the sidewall of the first spacer 132 and the upper surface of the first spacer 132 may form a seventh angle A21 which is an acute angle.

Figure 25:
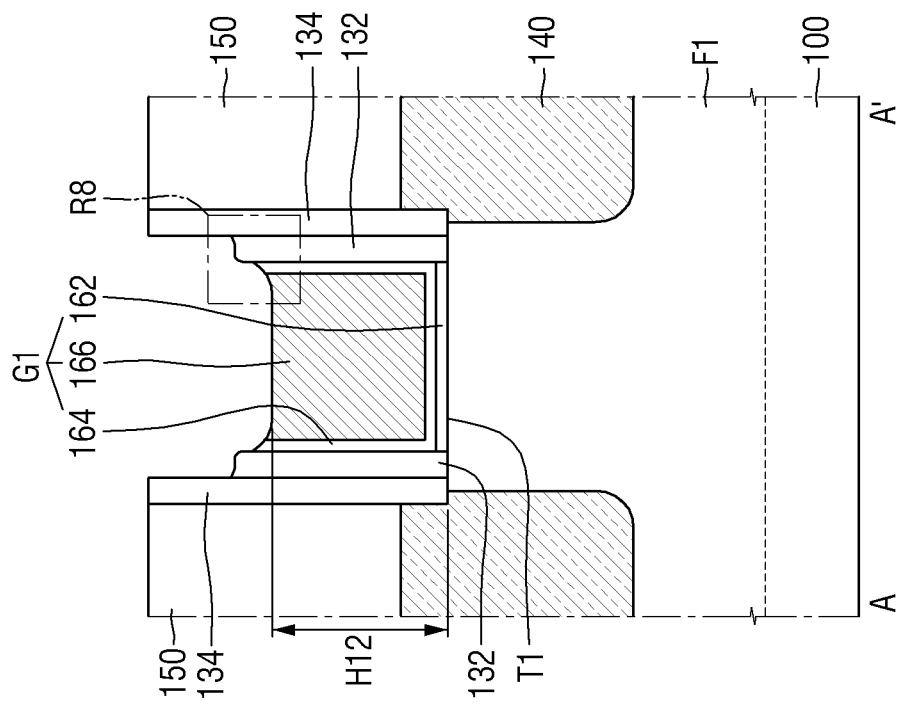
Figure 26:
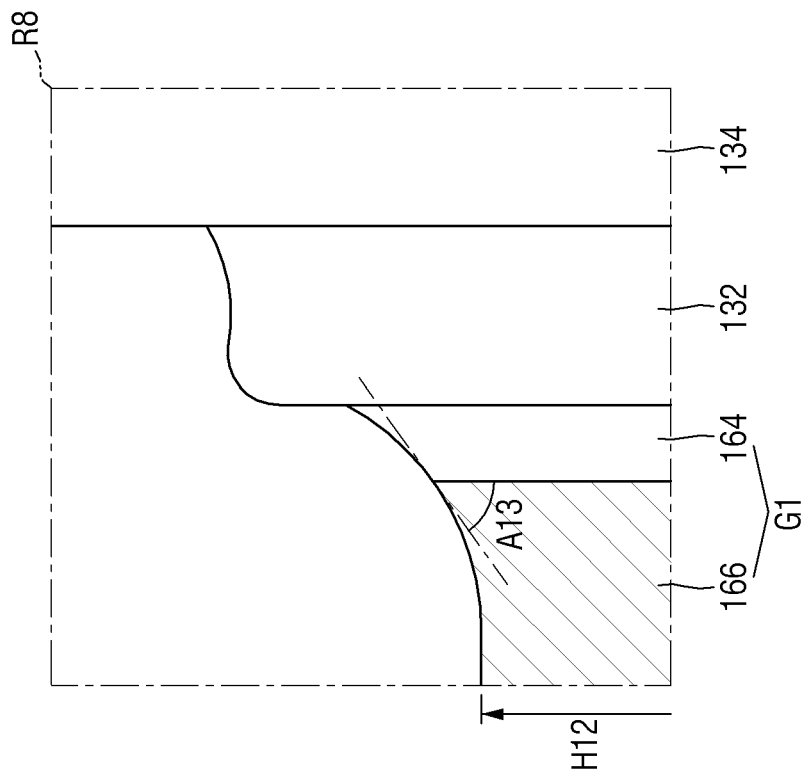

Referring to FIGS. 25 and 26, after performing the second etching process, a third etching process having a larger etching rate with respect to the first gate structure G1 than the first spacer 132 is performed.

The third etching process may be similar to the first etching process. Thus, a seventh height H12 of the first gate structure G1 may be lower than the fifth height H11 of the first gate structure G1 of FIG. 22. Further, as illustrated, the seventh height H12 of the first gate structure G1 may be lower than the height of the first spacer 132.

Due to the nature of the etching process, the upper surface of the first gate structure G1 adjacent to the first spacer 132 may include a cusp. For example, as shown in FIG. 26, after the third etching process is performed, the upper surface of the first gate structure G1 may be concave.

However, the cusp of the first gate electrode 166 may be gentle. For example, at the point where the upper surface of the first gate electrode 166 meets the sidewall of the first gate electrode 166, the upper surface of the first gate electrode 166 and the sidewall of the first gate electrode 166 may form an eighth angle A13 larger than the fifth angle A11 of FIG. 22.

However, in some exemplary embodiments, the third etching process may be omitted.

Figure 27:
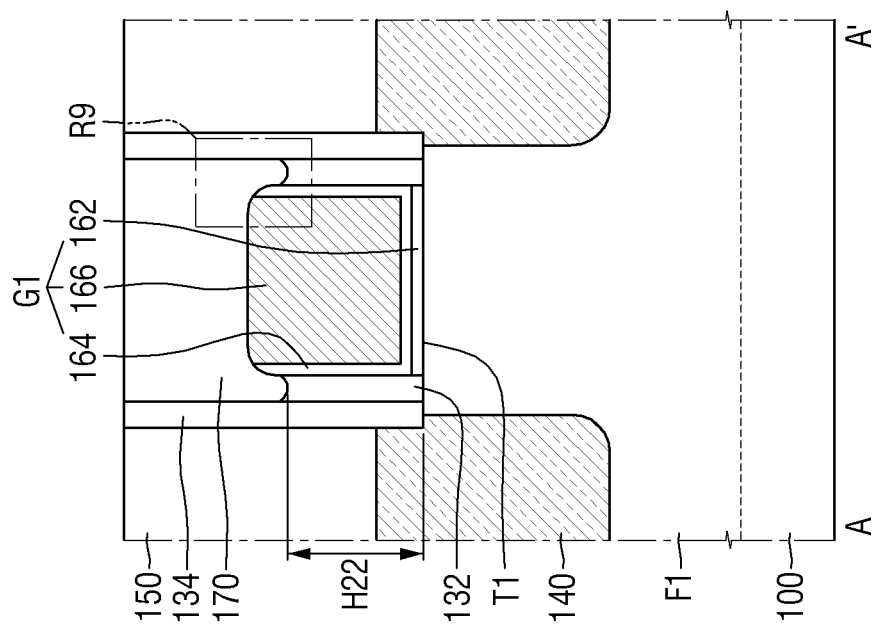
Figure 28:
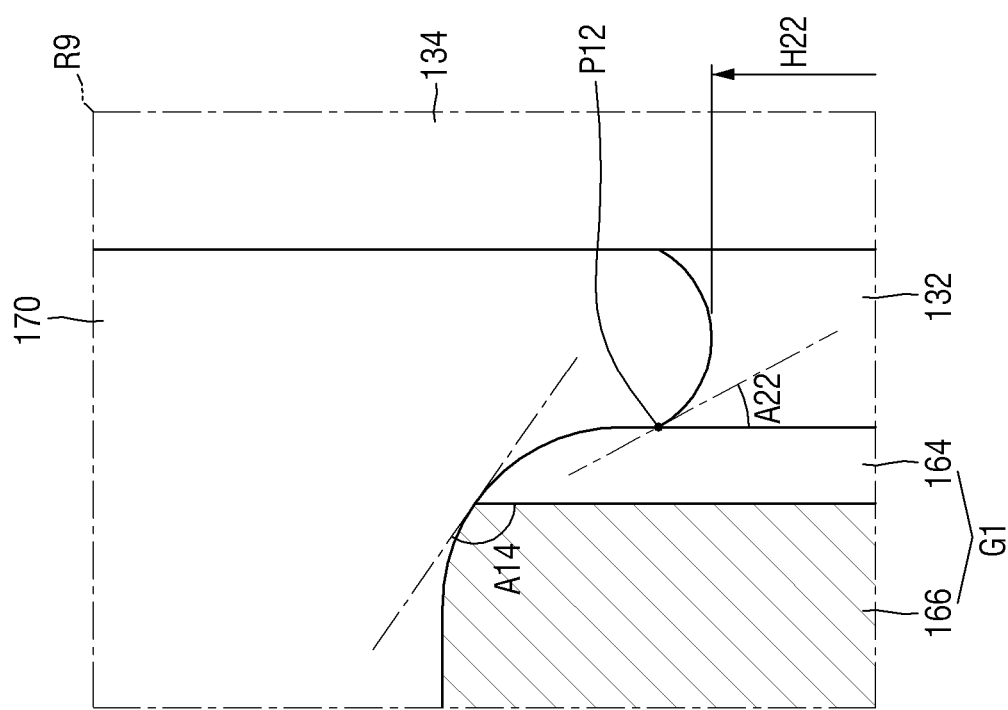

Referring to FIGS. 27 and 28, after the third etching process is performed, a fourth etching process having a larger etching rate with respect to the first spacer 132 than the first gate structure G1 is performed.

The fourth etching process may be similar to the second etching process. Thus, an eighth height H22 of the first spacer 132 may be lower than the sixth height H21 of the first spacer 132 of FIG. 24. Further, as illustrated, at a fourth point P12 on the sidewall of the first gate structure G1, the upper surface of the first spacer 132 and the first gate structure G1 may be in contact with each other.

In some exemplary embodiments, the fourth etching process may be performed until the upper surface of the first spacer 132 becomes lower than the upper surface of the first gate structure G1, but the present disclosure is not limited thereto.

By the fourth etching process, the cusp of the first gate electrode 166 may be more gentle. For example, at the point where the upper surface of the first gate electrode 166 meets the sidewall of the first gate electrode 166, the upper surface of the first gate electrode 166 and the sidewall of the first gate electrode 166 may form a ninth angle A14 larger than the sixth angle A12 of FIG. 24. For example, the ninth angle A14 may be an obtuse angle.

Further, due to the nature of the etching process, the upper surface of the first spacer 132 may be concave. Accordingly, the height of the lowermost portion of the upper surface of the first spacer 132 may be lower than the height of the fourth point P12. For example, as shown in FIG. 28, the eighth height H22 of the first spacer 132 may be lower than the height of the fourth point P12. Further, for example, at the fourth point P12, the sidewall of the first spacer 132 and the upper surface of the first spacer 132 may form a tenth angle A22, which is an acute angle. In some exemplary embodiments, the tenth angle A22 may be smaller than the seventh angle A21 of FIG. 24.

However, in some exemplary embodiments, the fourth etching process may be omitted.

Figure 29:
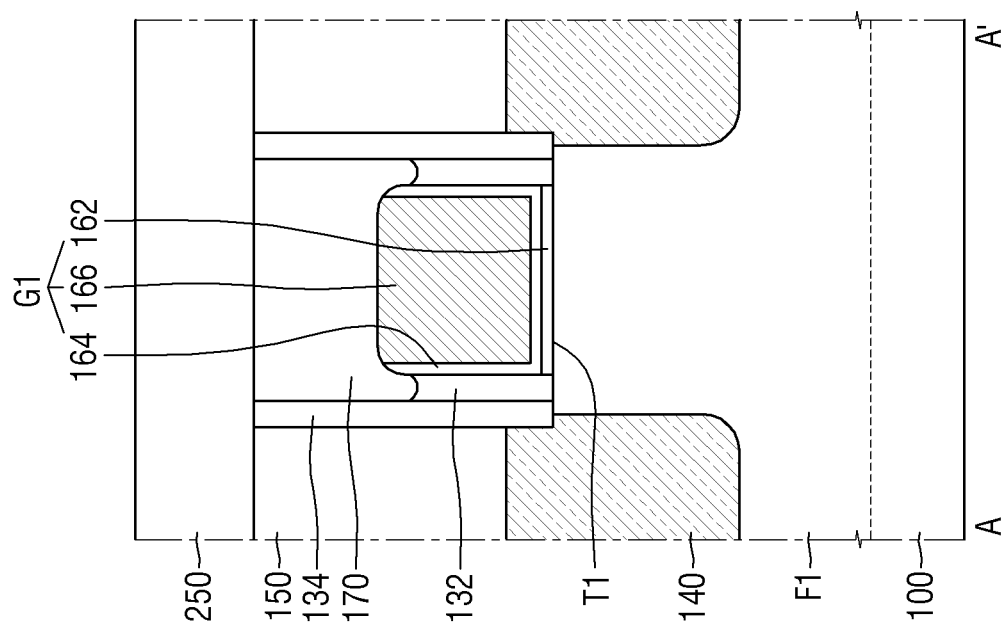

Referring to FIG. 29, the first capping pattern 170 is formed on the first gate structure G1 and the first spacer 132.

The first capping pattern 170 may fill a space formed by the second spacer 134. For example, the first capping pattern 170 may be formed on the resultant structure of FIGS. 27 and 28, and a planarization process may be performed. The planarization process may include, for example, a chemical mechanical polishing (CMP) process. Thus, the first capping pattern 170 may be formed to cover the upper surface of the first gate structure G1 and the upper surface of the first spacer 132.

Then, the second interlayer insulating film 250 is formed on the first interlayer insulating film 150.

For example, the second interlayer insulating film 250 may be formed to cover the upper surface of the first capping pattern 170, the upper surface of the second spacer 134 and the upper surface of the first interlayer insulating film 150.

Figure 30:
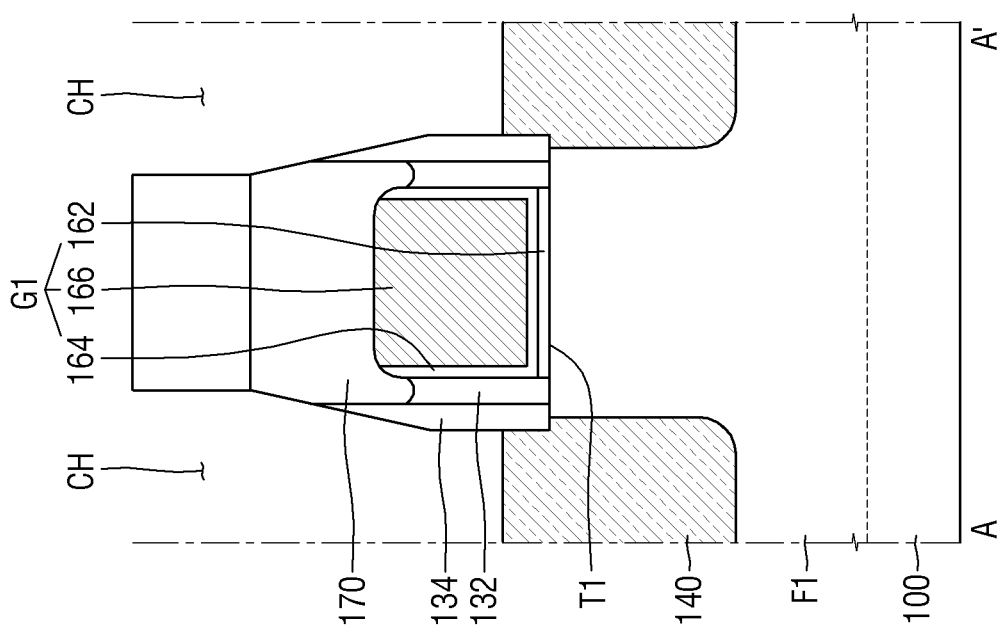

Referring to FIG. 30, the contact hole CH is formed to expose a portion of the first source/drain region 140.

For example, a portion of the first interlayer insulating film 150 and a portion of the second interlayer insulating film 250 may be etched to form the contact hole CH exposing a portion of the first source/drain region 140.

In the process of forming the contact hole CH, as illustrated, a portion of the first capping pattern 170 and a portion of the second spacer 134 may be etched. A portion of the first capping pattern 170 and a portion of the second spacer 134 may be etched by, for example, misalignment of the etching process for forming the contact hole CH. However, in some exemplary embodiments, the first spacer 132 may be protected without being etched.

Thus, in some exemplary embodiments, the contact hole CH defined by the sidewall of the second interlayer insulating film 250, the sidewall of the first capping pattern 170 and the sidewall of the second spacer 134 may be formed.

Then, referring to FIG. 5, the contact 180 is formed in the contact hole CH.

Accordingly, the contact 180 which is in contact with the first source/drain region 140 on the first source/drain region 140 may be formed.

However, the contact 180 may not be in contact with the first spacer 132.

Figure 31:
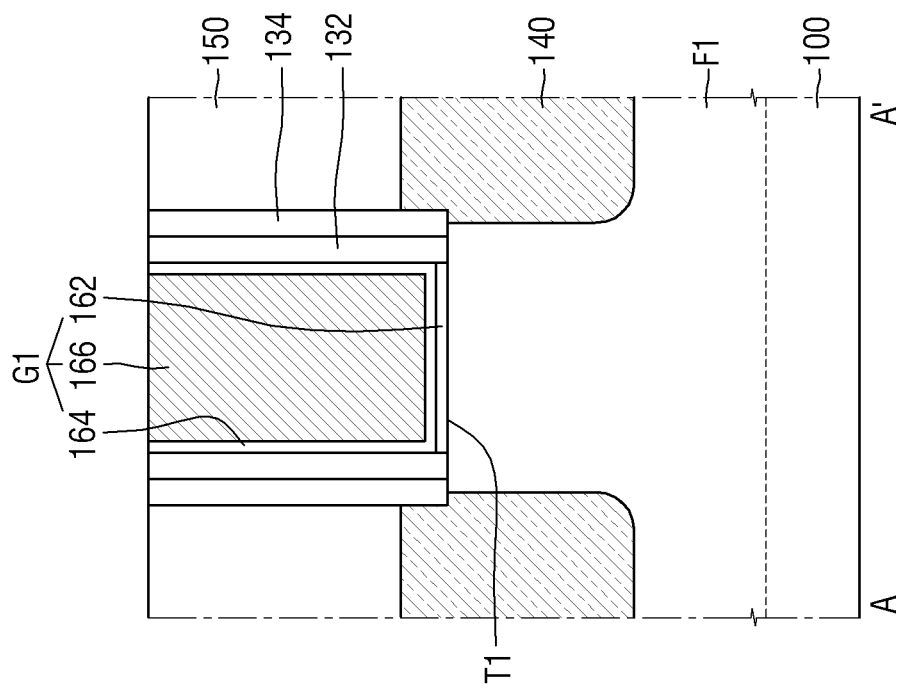

FIGS. 31 and 32 are views illustrating intermediate steps of a method for fabricating a semiconductor device according to some exemplary embodiments of the present inventive concept. For simplicity of description, a repeated description similar to the description with reference to FIGS. 1 to 30 will be briefly described or omitted.

For reference, FIGS. 31 and 32 are views illustrating steps after the step of FIG. 20.

Referring to FIG. 31, a planarization process may be performed on the resultant structure of FIG. 20. The planarization process may be performed, for example, until the upper surface of the first interlayer insulating film 150 is exposed.

The planarization process may include, for example, a chemical mechanical polishing (CMP) process.

Thus, the upper surface of the first gate structure G1, the upper surface of the second spacer 134, the upper surface of the first spacer 132 and the upper surface of the first interlayer insulating film 150 may be disposed on the same plane. However, the present disclosure is not limited thereto.

Referring to FIG. 32, a fifth etching process having a larger etching rate with respect to the first spacer 132 than the first gate structure G1 is performed.

The fifth etching process may be similar to the second etching process.

By the fifth etching process, the cusp of the first gate electrode 166 may be gentle. Further, the upper surface of the first spacer 132 may be lower than the upper surface of the first gate structure G1.

Further, due to the nature of the etching process, the upper surface of the first spacer 132 may be concave.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a substrate;
a first spacer defining a gate trench on the substrate, an upper surface of the first spacer being concave;
a gate structure in the gate trench, the upper surface of the first spacer being in contact with a sidewall of the gate structure at a first point;
a second spacer on a sidewall of the first spacer, an upper surface of the first spacer and an upper surface of the second spacer positioned at different heights from the substrate;
a source/drain region in the substrate on a sidewall of the gate structure;
a capping pattern covering an upper surface of the gate structure and the upper surface of the first spacer; and
a contact connected to the source/drain region on a sidewall of the second spacer, the second spacer interposed between the first spacer and the contact,
wherein the upper surface of the gate structure is curved such that a height of the upper surface of the gate structure adjacent to the first spacer increases in a direction away from the first spacer,
the gate structure includes a gate electrode and a gate insulating film between the gate electrode and the substrate and between the gate electrode and the first spacer,
a first distance from an uppermost portion of the gate electrode to an upper surface of the capping pattern is smaller than a second distance from an uppermost portion of the gate insulating film to the upper surface of the capping pattern,
the second distance is smaller than a third distance from the first point to the upper surface of the capping pattern,
the third distance is smaller than a fourth distance from a lowermost portion of the upper surface of the first spacer to the upper surface of the capping pattern, and
a sidewall of the contact is at least partially defined by the sidewall of the second spacer.

2. The semiconductor device of claim 1,
wherein an upper surface of the gate electrode adjacent to the gate insulating film is convex, and
an upper surface of the gate insulating film is convex.

3. The semiconductor device of claim 1,
wherein a height of the upper surface of the first spacer decreases and then increases in a direction away from the gate electrode.

4. The semiconductor device of claim 1,
wherein a first thickness of the gate insulating film in a direction parallel to an upper surface of the substrate is smaller than a second thickness of the first spacer in the direction parallel to the upper surface of the substrate.

5. The semiconductor device of claim 1,
wherein a first angle is formed at a point where an upper surface of the gate electrode meets a sidewall of the gate electrode, and
the first angle is an obtuse angle.

6. The semiconductor device of claim 1,
wherein a height of an upper surface of the gate insulating film decreases in a direction away from the gate electrode.

7. The semiconductor device of claim 1,
wherein the upper surface of the second spacer is higher than the upper surface of the gate electrode in a direction perpendicular to an upper surface of the substrate.

8. The semiconductor device of claim 1,
wherein the upper surface of the second spacer is lower than the upper surface of the gate electrode in a direction perpendicular to an upper surface of the substrate.

9. The semiconductor device of claim 1,
wherein the second spacer is extending along the sidewall of the first spacer and a sidewall of the capping pattern.

10. The semiconductor device of claim 1,
wherein the first spacer includes silicon oxide, and the second spacer includes silicon nitride.

11. The semiconductor device of claim 1,
wherein the upper surface of the gate structure includes a first portion adjacent to the first spacer and a second portion spaced apart from the first spacer,
a height of the first portion of the upper surface of the gate structure increases in a direction away from the first spacer, and
a height of the second portion of the upper surface of the gate structure is substantially the same in the direction away from the first spacer.

12. The semiconductor device of claim 1.
wherein the contact is further in contact with a sidewall of the capping pattern.

13. The semiconductor device of claim 12,
wherein the upper surface of the second spacer is connected to the sidewall of the capping pattern.

14. A semiconductor device comprising:
a substrate;
a gate structure on the substrate, wherein the gate structure includes a gate electrode and a gate insulating film extending along a bottom surface and a sidewall of the gate electrode; and
a first spacer on a sidewall of the gate structure;
a capping pattern covering an upper surface of the gate structure and an upper surface of the first spacer; and
a second spacer on a sidewall of the first spacer and a sidewall of the capping pattern;
a source/drain region in the substrate on a sidewall of the gate structure; and a contact connected to the source/drain region on a sidewall of the second spacer, the second spacer interposed between the first spacer and the contact, wherein the upper surface of the gate structure and the upper surface of the first spacer are connected to each other to form a convex upper surface of the gate structure with respect to an upper surface of the substrate, and the first spacer includes a concave upper surface with respect to the upper surface of the substrate, a first distance from an uppermost portion of the gate electrode to an upper surface of the capping pattern is smaller than a second distance from an uppermost portion of the gate insulating film to the upper surface of the capping pattern, the second distance is smaller than a third distance from an uppermost portion of the upper surface of the first spacer to the upper surface of the capping pattern, the third distance is smaller than a fourth distance from a lowermost portion of the upper surface of the first spacer to the upper surface of the capping pattern, and a sidewall of the contact is defined by at least one of the sidewall of the second spacer, and the sidewall of the capping pattern.

15. The semiconductor device of claim 14, wherein a first thickness of the gate insulating film in a direction parallel to an upper surface of the substrate is smaller than a second thickness of the first spacer in the direction parallel to the upper surface of the substrate.

16. The semiconductor device of claim 14, wherein an uppermost portion of the convex upper surface of the gate structure is higher in a direction perpendicular to the upper surface of the substrate than a lowermost portion of the concave upper surface of the first spacer.

17. The semiconductor device of claim 14, wherein the convex upper surface of the gate structure is adjacent to the sidewall of the first spacer.

18. The semiconductor device of claim 14, wherein a bottom surface of the capping pattern has a wavy shape.

* * * * *